United States Patent
Kano et al.

(10) Patent No.: US 8,241,749 B2
(45) Date of Patent: Aug. 14, 2012

(54) BARRIER LAMINATE, GAS BARRIER FILM, AND DEVICE USING THE SAME

(75) Inventors: Kenji Kano, Kanagawa (JP); Shigehide Ito, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 360 days.

(21) Appl. No.: 12/557,087

(22) Filed: Sep. 10, 2009

(65) Prior Publication Data

US 2010/0068537 A1  Mar. 18, 2010

(30) Foreign Application Priority Data

Sep. 11, 2008 (JP) .................. 2008-233536

(51) Int. Cl.
*B32B 18/00* (2006.01)
*B32B 27/06* (2006.01)
*B32B 27/30* (2006.01)
*B32B 27/38* (2006.01)

(52) U.S. Cl. ..................... 428/411.1; 428/413; 428/426; 428/522; 428/702

(58) Field of Classification Search .................. None
See application file for complete search history.

(56) References Cited

U.S. PATENT DOCUMENTS

| | | |
|---|---|---|
| 5,635,105 A | 6/1997 | Kawata et al. |
| 6,413,645 B1 | 7/2002 | Graff et al. |
| 2002/0125822 A1 | 9/2002 | Graff et al. |
| 2003/0203210 A1 | 10/2003 | Graff et al. |
| 2004/0195967 A1 | 10/2004 | Padiyath et al. |
| 2006/0226517 A1 | 10/2006 | Iwanaga et al. |
| 2007/0065600 A1 | 3/2007 | Hammond-Smith |

OTHER PUBLICATIONS

Bacher A. et al., "Photo-Cross-Linked Triphenylenes as Novel Insoluble Hole Transport Materials in Organic Leds," Macromolecules, ACS, vol. 32, No. 14, 1999, pp. 4551-4557.
Okazaki, M. et al., "Polymerizable discoticnematic triphenylene derivatives and Their Application to an Optically Anisotropic Film," Polymers for Advanced Technologies, vol. 11, pp. 398-403, 2000.
European Search Report Issued on Nov. 12, 2009 for Application No. 09170042.

*Primary Examiner* — Ramsey Zacharia
(74) *Attorney, Agent, or Firm* — Birch, Stewart, Kolasch & Birch, LLP

(57) ABSTRACT

Disclosed is a barrier laminate comprising at least one organic layer and at least one inorganic layer on a surface of the organic layer, wherein the organic layer is formed by curing a polymerizable composition comprising a compound having a triphenylene skeleton and a polymerizable group.

21 Claims, No Drawings

BARRIER LAMINATE, GAS BARRIER FILM, AND DEVICE USING THE SAME

FIELD OF THE PRESENT INVENTION

The present invention relates to a bather laminate, a gas barrier film, and a device using them.

DESCRIPTION OF THE RELATED ART

Heretofore various barrier laminates have been studied and developed. For example, JP-A 10-278167 discloses a bather film in which, on one surface of a resin film, an acrylate resin layer which was formed by a vacuum ultraviolet cure method and a deposited thin film of a metal or a metal compound were for rued in that order. However, there is an increased demand for a gas bather film having higher gas barrier property in recent years.

SUMMARY OF THE PRESENT INVENTION

The present invention is to solve the above-mentioned problems and to provide a gas bather film having higher barrier property.

Given the situation as above, the present inventors have found that, when an inorganic layer is formed, the difference of type of an organic layer which is the underlayer of the inorganic layer greatly affects the bather property of the bather laminate. The inventors further have studied and found that bather property is extremely improved by using an organic layer obtained by curing a polymerizable composition comprising a compound having a triphenylene skeleton and a polymerizable group and forming an inorganic layer on the surface of the organic layer. Especially, the inventor found that, when the inorganic layer is formed by a sputtering process, the improvement of the bather property is more effective. Specifically the above-mentioned problems can be solved by the present invention that provides the following:

[1] A bather laminate comprising at least one organic layer and at least one inorganic layer on a surface of the organic layer, wherein the organic layer is formed by curing a polymerizable composition comprising a compound having a triphenylene skeleton and a polymerizable group.

[2] The bather laminate according to [1], wherein the triphenylene skeleton and the polymerizable group bond to each other via a linking group having an aromatic ring.

[3] The bather laminate according to [1] or [2], wherein the compound having a triphenylene skeleton and a polymerizable group has at least two polymerizable groups.

[4] The barrier laminate according to [1], wherein the compound having a triphenylene skeleton and a polymerizable group is represented by Formula (A);

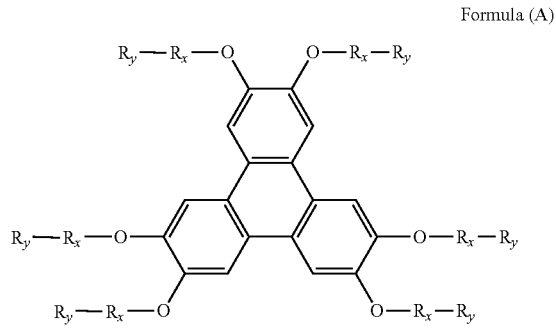

Formula (A)

wherein Rx's each are a linking group, and Ry's each are a polymerizable group.

[5] The bather laminate according to any one of [1] to [4], wherein the polymerizable group is an ethylenic double bond or a ring-opening polymerizable group.

[6] The bather laminate according to [1], wherein the compound having a triphenylene skeleton and a polymerizable group is at least one selected from a compound represented by Formula (1), a compound represented by Formula (2), a compound represented by Formula (3) and a compound represented by Formula (4);

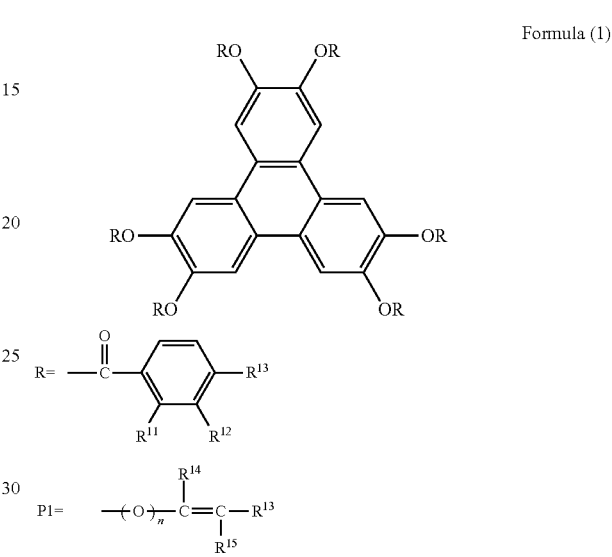

Formula (1)

wherein $R^{11}$ and $R^{12}$ each are a hydrogen atom or a methyl group; $R^{13}$ is an alkoxy group comprising the above substituent P1; $R^{14}$, $R^{15}$ and $R^{16}$ in the substituent P1 each are a hydrogen atom or an alkyl group; and n is 0 or 1;

Formula (2)

wherein $R^{21}$ and $R^{22}$ each are a hydrogen atom or a methyl group; $R^{23}$ is an alkoxy group comprising the above substituent P2; and $R^{24}$, $R^{25}$ and $R^{26}$ in the substituent P2 each are a hydrogen atom or an alkyl group;

Formula (3)

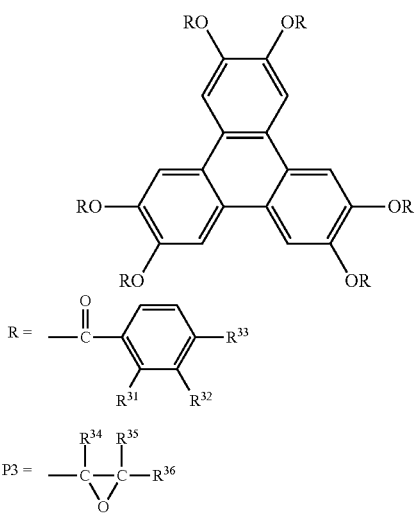

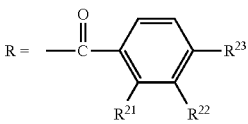

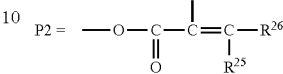

wherein $R^{21}$ and $R^{22}$ each are a hydrogen atom or a methyl group; $R^{23}$ is an alkoxy group comprising the above substituent P2; and $R^{24}$, $R^{25}$ and $R^{26}$ in the substituent P2 each are a hydrogen atom or an alkyl group.

[9] The bather laminate according to any one of [1] to [8], wherein the polymerizable composition comprises a bifunctional or more functional (meth)acrylate without a triphenylene skeleton.

wherein $R^{31}$ and $R^{32}$ each are a hydrogen atom or a methyl group; $R^{33}$ is an alkoxy group comprising the above substituent P3; and $R^{34}$, $R^{35}$ and $R^{36}$ in the substituent P3 each are a hydrogen atom or an alkyl group;

[10] The bather laminate according to [9], wherein the bifunctional or more functional (meth)acrylate comprises a cyclic structure.

[11] The bather laminate according to [9], wherein the bifunctional or more functional (meth)acrylate is represented by Formula (5);

Formula (4)

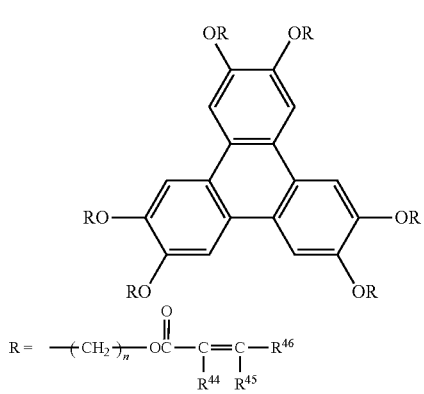

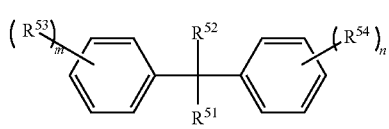

Formula (5)

wherein $R^{51}$ and $R^{52}$ each are a hydrogen atom, an alkyl group, or an aryl group; $R^{51}$ and $R^{52}$ may bond to each other to form a ring; $R^{53}$ and $R^{54}$ each are a substituent; m and n each are an integer of 0 to 5; (m+n) is not less than 2; when m is not less than 2, each $R^{53}$ may be the same or different; when n is not less than 2, each $R^{54}$ may be the same or different; and at least two of $R^{53}$ and $R^{54}$ have a (meth)acryloyloxy group.

wherein $R^{44}$, $R^{45}$ and $R^{46}$ are a hydrogen atom or an alkyl group; and n is an integer of 2 to 12.

[7] The barrier laminate according to any one of [1] to [6], wherein the polymerizable group is a (meth)acryloyloxy group.

[8] The bather laminate according to [1], wherein the compound having a triphenylene skeleton and a polymerizable group is a compound represented by Formula (2);

[12] The barrier laminate according to any one of [1] to [11], wherein the inorganic layer comprises a metal oxide.

[13] The barrier laminate according to [12], wherein the metal oxide is silicon oxide, aluminum oxide, or silicon aluminum oxide.

[14] The barrier laminate according to [12] or [13], wherein the inorganic layer comprising a metal oxide is formed by a sputtering process.

[15] The bather laminate according to any one of [1] to [14], wherein at least two organic layers and at least two inorganic layers are laminated alternately.

Formula (2)

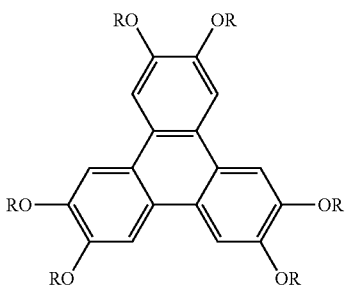

[16] A gas bather film comprising a support and a bather laminate comprising at least one organic layer and at least one inorganic layer on a surface of the organic layer, wherein the organic layer is formed by curing a polymerizable composition comprising a compound having a triphenylene skeleton and a polymerizable group.

[17] A device comprising a bather laminate comprising at least one organic layer and at least one inorganic layer on a surface of the organic layer, wherein the organic layer is formed by curing a polymerizable composition comprising a compound having a triphenylene skeleton and a polymerizable group.

[18] The device according to [17], comprising, as a substrate, a gas barrier film comprising the barrier laminate.
[19] The device according to [17] or [18], sealed with a gas barrier film comprising the barrier laminate, or the barrier laminate.
[20] The device according to any one of [17] to [19], which is an electronic device.
[21] The device according to any one of [17] to [19], which is an organic EL device.
[22] A method for producing a barrier laminate comprising at least one organic layer and at least one inorganic layer on a surface of the organic layer, wherein the organic layer is formed by curing a polymerizable composition comprising a compound having a triphenylene skeleton and a polymerizable group, which comprises forming the inorganic layer by a sputtering process.

According to the present invention, a bather laminate having higher barrier property can be provided.

BEST MODE FOR CARRYING OUT THE PRESENT INVENTION

The contents of the present invention are described in detail hereinunder. In this description, the numerical range expressed by the wording "a number to another number" means the range that falls between the former number indicating the lowermost limit of the range and the latter number indicating the uppermost limit thereof. The organic EL device as referred to in the present invention means an organic electroluminescent device. In this description, (meth)acylate means both acrylate and methacrylate.
<Barrier Laminate>

The barrier laminate of the present invention comprises an organic layer and an inorganic layer on a surface of the organic layer, and preferably comprises a laminate wherein at least two organic layers and at least two inorganic layers are laminated alternately.

The barrier laminate of the present invention may contain a gradation material layer where organic regions and inorganic regions continuously change in the thickness direction of the layer without departing from the gist of the present invention. As examples of the gradation material, there are mentioned materials described in Kim et al's report, Journal of Vacuum Science and Technology A Vol. 23 pp. 971-977 (2005 American Vacuum Society); and gradation layers of an organic region and an inorganic layer region with no boundary therebetween as in US Laid-Open 2004-46497.
(Organic Layer)

The organic layer in the present invention is obtained by curing a composition comprising a compound having a triphenylene skeleton and a polymerizable group. The polymerizable getup is not specifically defined, however; preferably an ethylenic double bond or a ring-opening polymerizable group, more preferably an ethylenic double bond, even more preferably an ethylenic double bond which is conjugated with a carbonyl group, still more preferably a (meta)acryloyloxy group.

In the compound having a triphenylene skeleton and a polymerizable group, the polymerizable group may directly bond to a triphenylene skeleton, however, preferably bonds to a triphenylene skeleton via a linking group, more preferably bonds to a triphenylene skeleton via a linking group comprising an aromatic ring.

In the compound having a triphenylene skeleton and a polymerizable group, the number of the polymerizable groups may be one, however preferably at least two, more preferably at least three. The upper limit of the number of the polymerizable group is not specifically defined, preferably 12 or less, more preferably 6 or less.

The compound having a triphenylene skeleton and a polymerizable group of the present invention is preferably a compound represented by Formula (A), more preferably one or more compounds selected from compounds represented by Formulae (1), (2), (3) and (4).

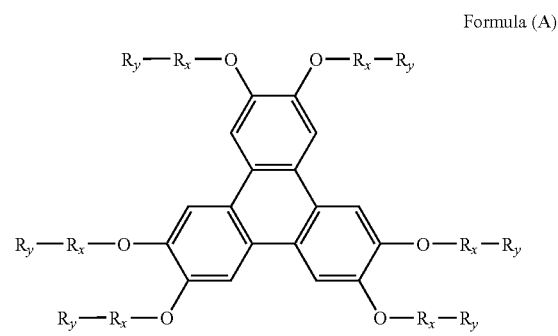

Formula (A)

wherein Rx's each are a linking group, and Ry's each are a polymerizable group.

Examples of Rx include a single bond, an ether group, a thioether group, a carbonyl group, an alkylene group (for example, methylene group, ethylene group, propylene group, butylene group, hexylene group, decylene group and dodecylene group, an arylene group (for example, phenylene group and naphthalene group), and a group obtained by bonding two or more groups thereof in series. Rx is preferably an ether group, a carbonyl group, an alkylene group, or an arylene group, or a group obtained by bonding two or more groups thereof in series, more preferably a group comprising at least one arylene group.

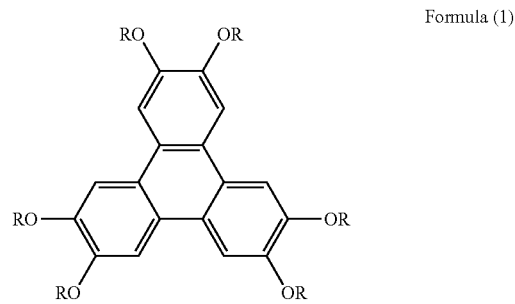

Formula (1)

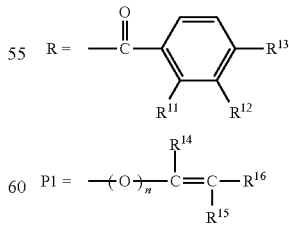

wherein $R^{11}$ and $R^{12}$ each are a hydrogen atom or a methyl group; $R^{13}$ is an alkoxy group comprising the above substituent P1; $R^{14}$, $R^{15}$ and $R^{16}$ in the substituent P1 each are a hydrogen atom or an alkyl group; and n is 0 or 1.

Formula (2)

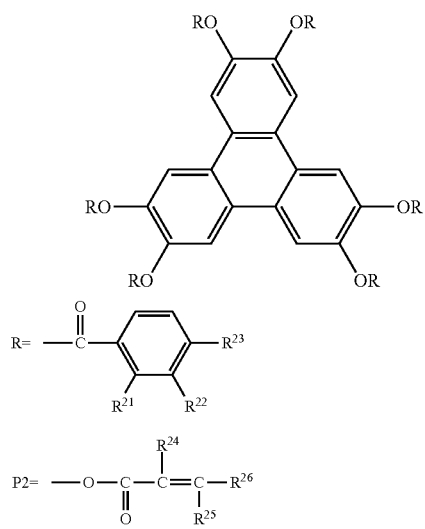

wherein $R^{21}$ and $R^{22}$ each are a hydrogen atom or a methyl group; $R^{23}$ is an alkoxy group comprising the above substituent P2; and $R^{24}$, $R^{25}$ and $R^{26}$ in the substituent P2 each are a hydrogen atom or an alkyl group.

Formula (3)

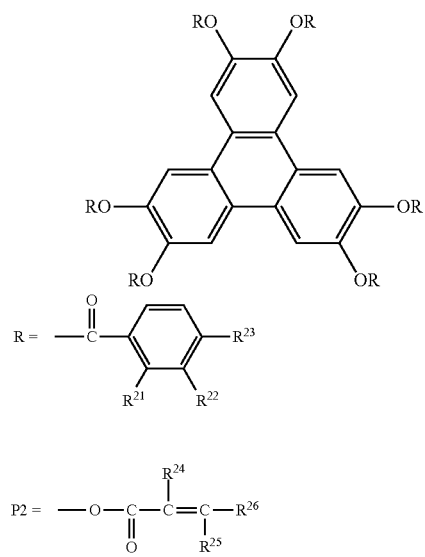

wherein $R^{31}$ and $R^{32}$ each are a hydrogen atom or a methyl group; $R^{33}$ is an alkoxy group comprising the above substituent P3; and $R^{34}$

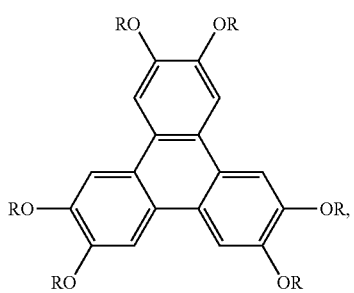

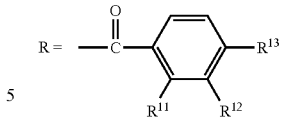

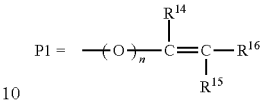

$R^{35}$ and $R^{36}$ in the substituent P3 each are a hydrogen atom or an alkyl group;

Formula (4)

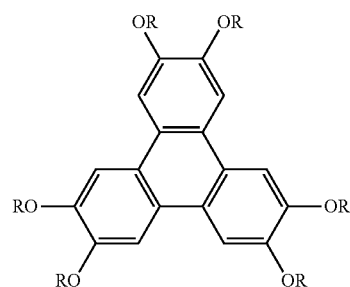

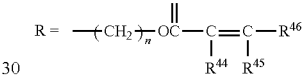

wherein $R^{44}$, $R^{45}$ and $R^{46}$ are a hydrogen atom or an alkyl group; and n is an integer of 2 to 12.

Hereinafter, Formula (1) is described in detail.

$R^{11}$ and $R^{12}$ each are a hydrogen atom or a methyl group.

When n is 0, the substituent P1 is an unsaturated double bond group.

The substituent $R^{14}$ and $R^{15}$ each are a hydrogen atom, or an alkyl group (methyl group, ethyl group, n-propyl group, isopropyl group, n-butyl group, pentyl group, hexyl group, heptyl group, octyl group and nonyl group are exemplified, and a lower alkyl group such as methyl group and ethyl group is preferable, wherein a lower alkyl group means an alkyl group having 1 to 6 carbon atoms, and hereinafter is the same). More preferable is a combination wherein $R^{14}$ is a methyl group and $R^{15}$ is a hydrogen atom, or a combination wherein both of $R^{14}$ and $R^{15}$ are a hydrogen atom.

$R^{16}$ is a hydrogen atom, or a substituted or unsubstituted alkyl group (methyl group, ethyl group, n-propyl group, isopropyl group, n-butyl group, pentyl group, hexyl group, heptyl group, octyl group, nonyl group, 2-chloroetyl group, 3-metoxyethyl group, and methoxyethoxyethyl group are exemplified, a lower alkyl group such as methyl group and an ethyl group is preferable, and a methyl group is more preferable). A hydrogen atom or a lower alkyl group is more preferable, and a hydrogen atom is further more preferable.

The alkoxy residue which is substituted with the terminal substituent P1 is an alkyleneoxy group (for example, an alkyleneoxy group such as ethyleneoxy group, propyleneoxy group, butyleneoxy group, pentyleneoxy group, hexyleneoxy group, and heptyleneoxy group and a substituted alkyleneoxy group comprising an ether bond such as an ethyleneoxyethoxy group). Alternatively, the substituent P1 may directly bond to an aromatic ring.

When n is 1, the terminal substrate P1 as $R^{13}$ is a vinylether group.

$R^{14}$ and $R^{15}$ of the substituent P1 each are a hydrogen atom, or an alkyl group (methyl group, ethyl group, n-propyl group, isopropyl group, n-butyl group, pentyl group, hexyl group, heptyl group, octyl group, and nonyl group are exemplified, and a lower alkyl group such as methyl group and ethyl group are preferable, and a methyl group is more preferable). More preferable is a combination wherein $R^{14}$ is a methyl group and $R^{15}$ is a hydrogen atom, or a combination wherein both of $R^{14}$ and $R^{15}$ are a hydrogen atom.

$R^{16}$ is hydrogen atom, or a substituted or unsubstituted alkyl group (methyl group, ethyl group, n-propyl group, isopropyl group, n-butyl group, pentyl group, hexyl group, heptyl group, octyl group, nonyl group, 2-chloroetyl group, 3-metoxyethyl group, and methoxyethoxyethyl group are exemplified, a lower alkyl group such as methyl group and ethyl group is preferable, and a methyl group is more preferable). A hydrogen atom or a lower alkyl group is more preferable, and a hydrogen atom is further more preferable. The substituent P1 is an unsubstituted vinyloxy group, which is generally a functional group having a high polymerization activity.

The alkoxy residue which is substituted with the terminal substituent P1 is an alkyleneoxy group such as ethyleneoxy group, propyleneoxy group, butyleneoxy group, pentyleneoxy group, hexyleneoxy group, and heptyleneoxy group, and an alkyleneoxy-substituted alkoxy group such as an ethyleneoxyethoxy group.

Specific examples of the compounds represented by Formula (1) are shown below, to which, however, the present invention should not be limited.

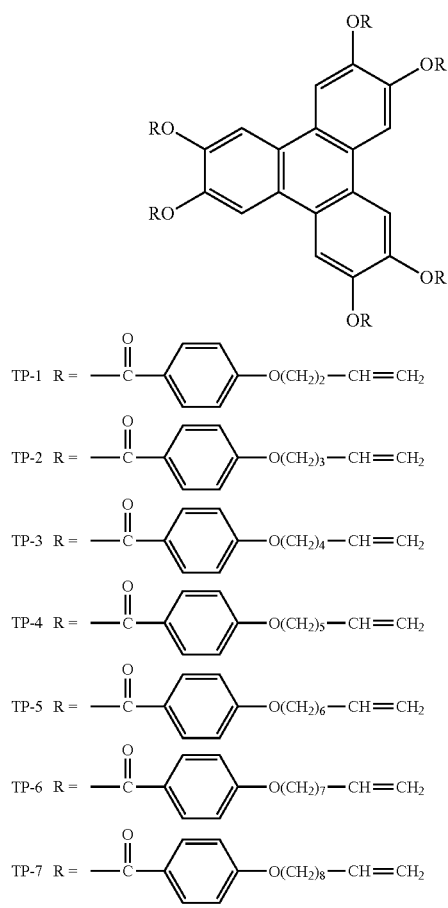

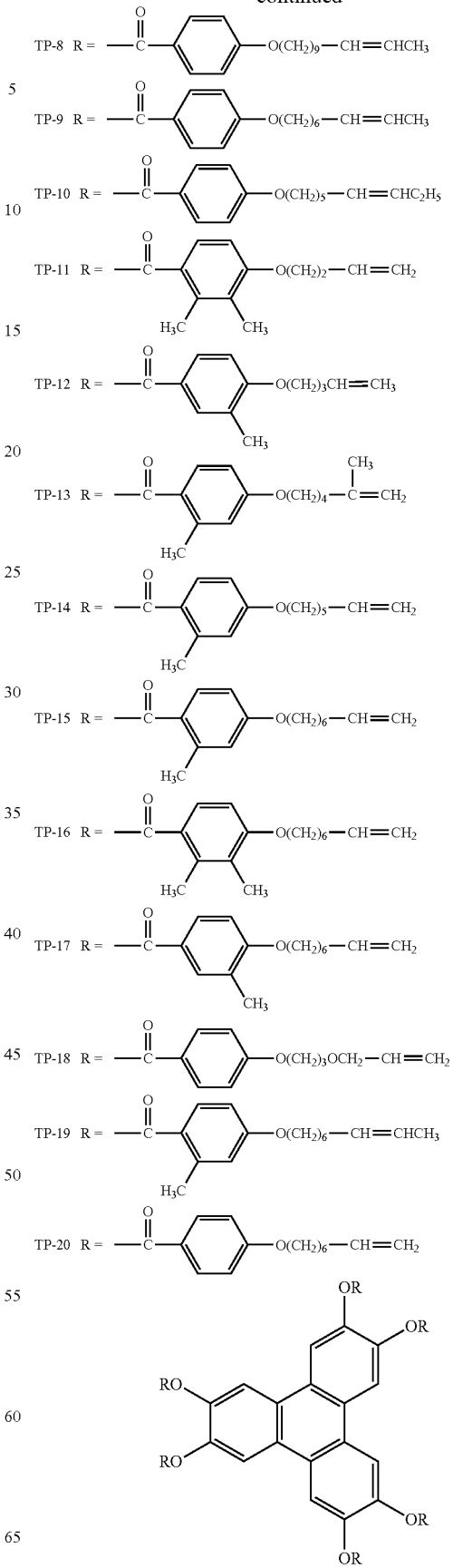

-continued
TP-21 R = 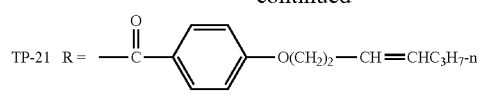
TP-22 R = 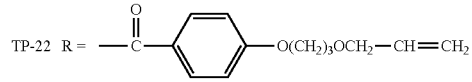
TP-23 R = 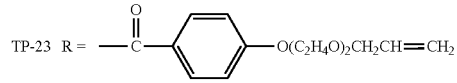
TP-24 R = 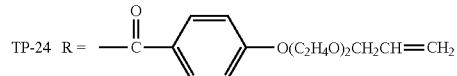
TP-25 R = 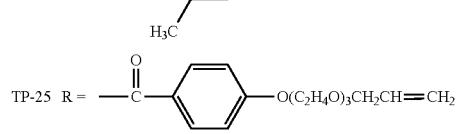
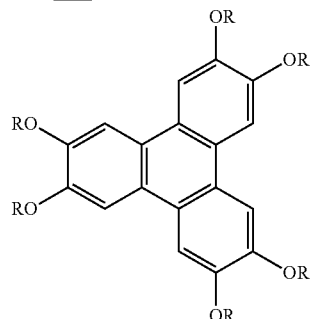
TP-26 R = 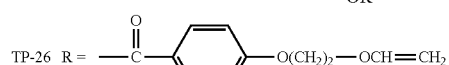
TP-27 R = 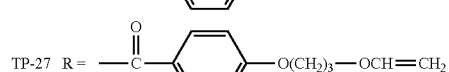
TP-28 R = 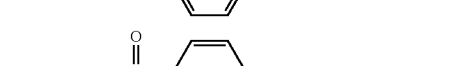
TP-29 R = 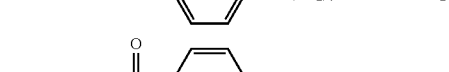
TP-30 R = 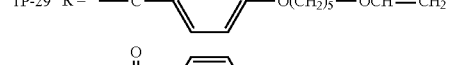
TP-31 R = 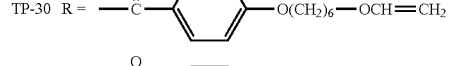
TP-32 R = 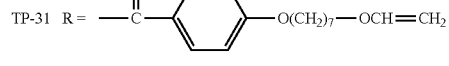
TP-33 R = 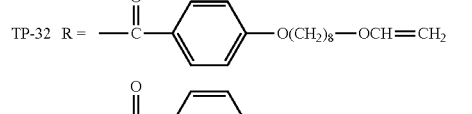
TP-34 R = 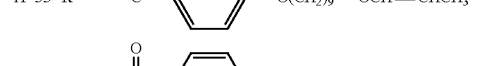
TP-35 R = 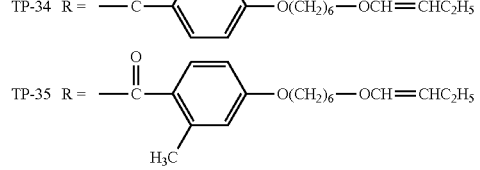
TP-36 R = 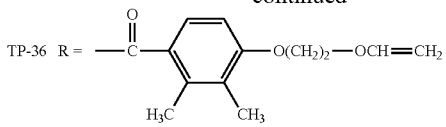
TP-37 R = 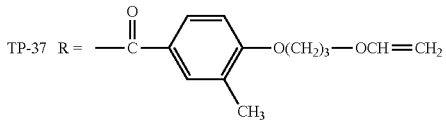
TP-38 R = 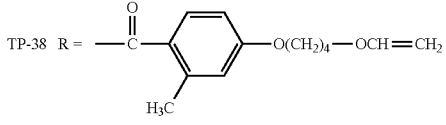
TP-39 R = 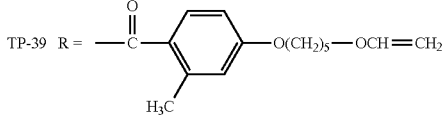
TP-40 R = 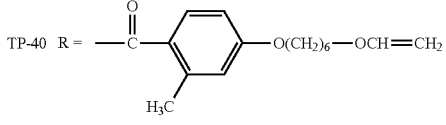
TP-41 R = 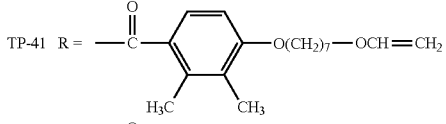
TP-42 R = 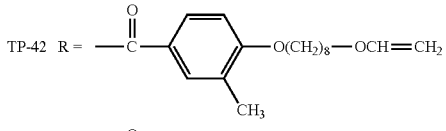
TP-43 R = 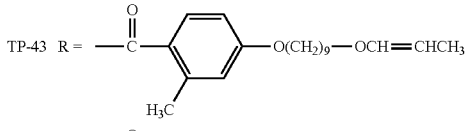
TP-44 R = 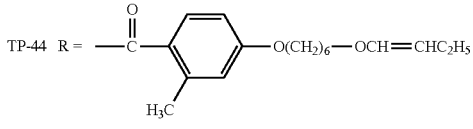
TP-45 R = 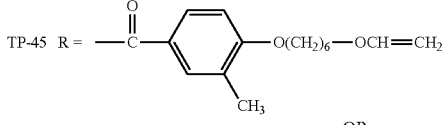
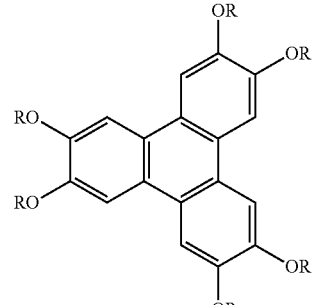
TP-46 R = 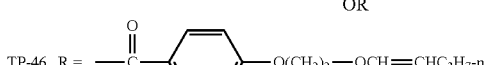
TP-47 R = 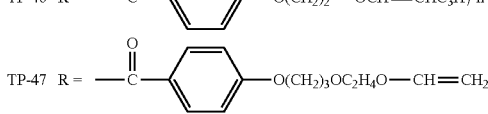

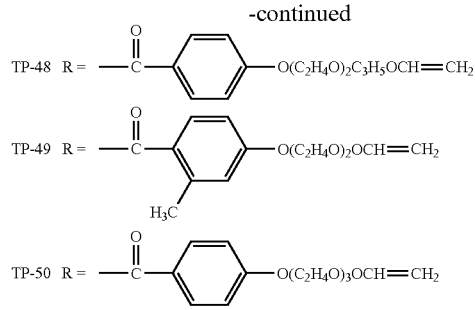

Formula (2) is described in detail. $R^{21}$ and $R^{22}$ each are a hydrogen atom or a methyl group.

The terminal substituent P2 as $R^{23}$ is an acryl group. $R^{24}$ and $R^{25}$ in the substituent P2 each are a hydrogen atom, or an alkyl group (methyl group, ethyl group, n-propyl group, iso-propyl group, n-butyl group, pentyl group, hexyl group, heptyl group, octyl group, and nonyl group are exemplified; a lower alkyl group such as methyl group and ethyl group are preferable, and a methyl group is more preferable). More preferable is a combination wherein $R^{24}$ is a methyl group and $R^{25}$ is a hydrogen atom, or a combination wherein both of $R^{24}$ and $R^{25}$ are a hydrogen atom.

$R^{26}$ is a hydrogen atom, or a substituted or unsubstituted alkyl group (methyl group, ethyl group, n-propyl group, iso-propyl group, n-butyl group, pentyl group, hexyl group, heptyl group, octyl group, nonyl group, 2-chloroetyl group, 3-metoxyethyl group, and methoxyethoxyethyl group are exemplified, a lower alkyl group such as methyl group and ethyl group is preferable, and a methyl group is more preferable). The substituent P2 is preferably an unsubstituted acryloyloxy group, an unsubstituted methacryloyloxy group, or an unsubstituted crotonyloxy group, which is generally a functional group having a high polymerization activity.

The alkoxy residue which is substituted with the terminal substituent P2 is an alkyleneoxy group (for example, an alkyleneoxy group such as ethyleneoxy group, propyleneoxy group, butyleneoxy group, pentyleneoxy group, hexyleneoxy group, and heptyleneoxy group, and a substituted alkyleneoxy group comprising an ether bond such as ethyleneoxyethoxy group).

Specific examples of the compounds represented by Formula (2) are shown below, to which, however, the present invention should not be limited.

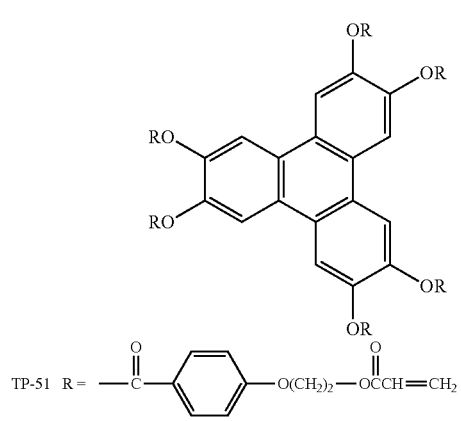

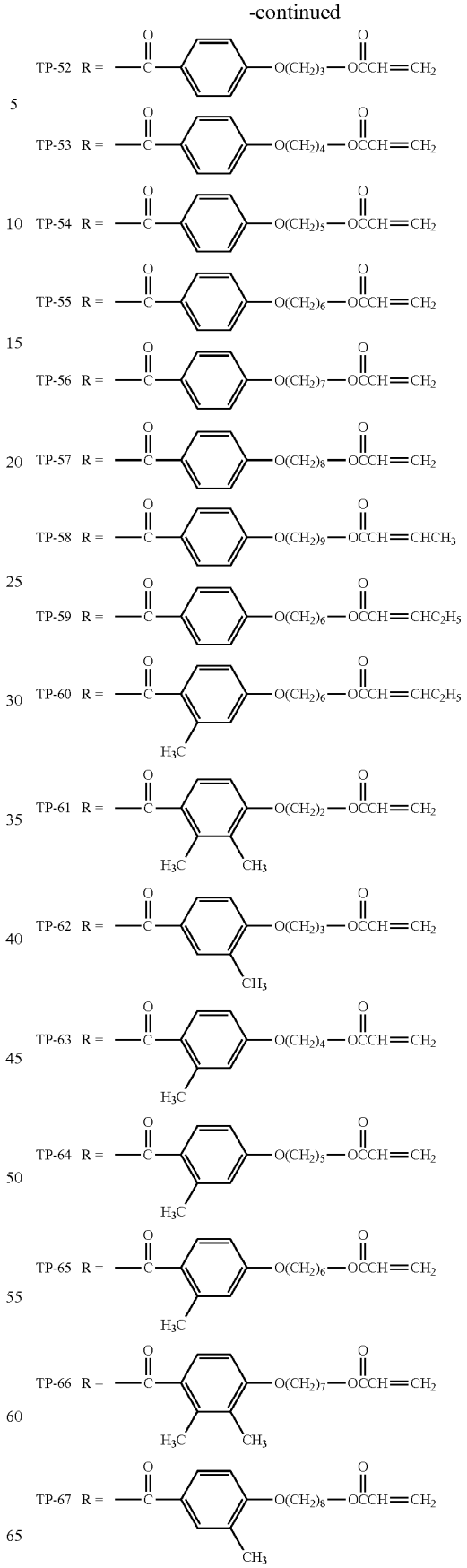

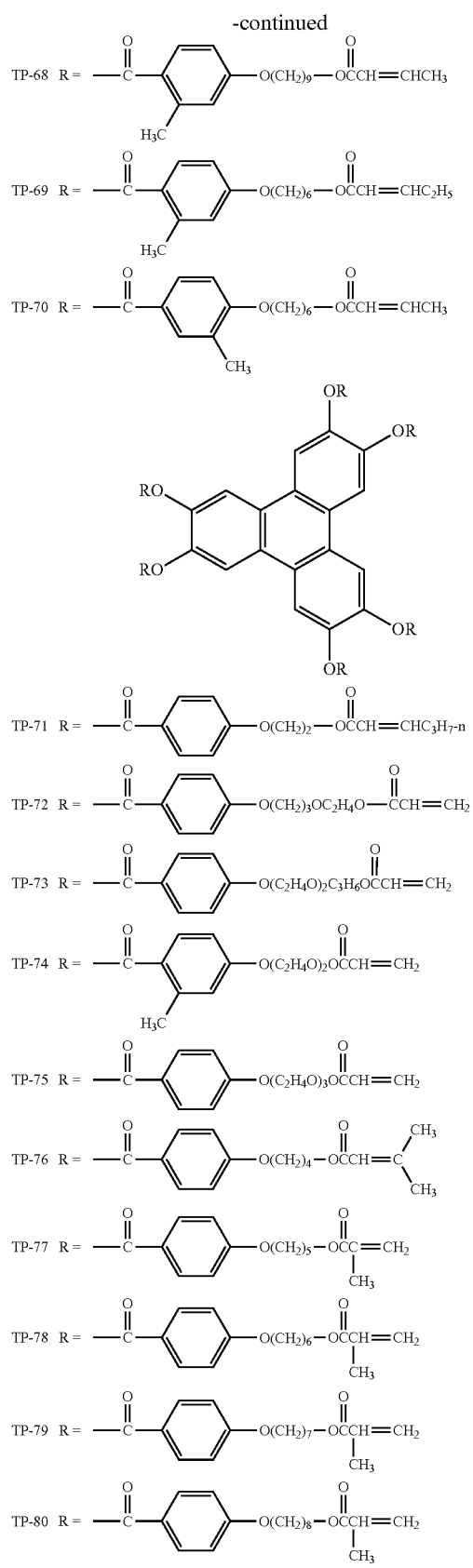

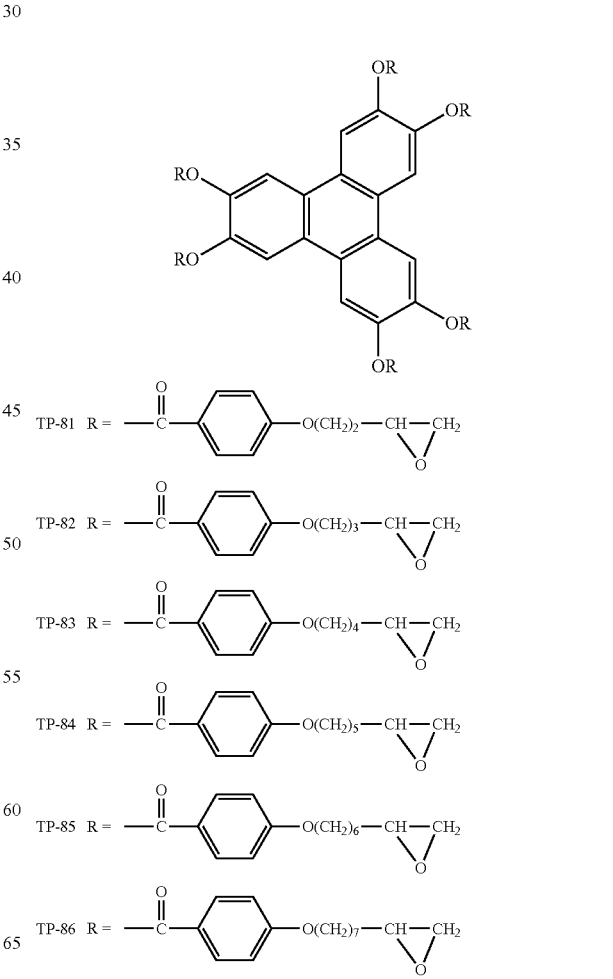

The terminal substituent P3 as $R^{33}$ is an oxirane group. $R^{34}$ and $R^{35}$ in the substituent P3 each are a hydrogen atom, or an alkyl group (methyl group, ethyl group, n-propyl group, iso-propyl group, n-butyl group, pentyl group, hexyl group, heptyl group, octyl group, and nonyl group are exemplified; a lower alkyl group such as methyl group and ethyl group are preferable, and a methyl group is more preferable). More preferable is a combination wherein both of $R^{34}$ and $R^{35}$ are a hydrogen atom.

$R^{36}$ is a hydrogen atom, or a substituted or unsubstituted alkyl group (methyl group, ethyl group, n-propyl group, iso-propyl group, n-butyl group, pentyl group, hexyl group, heptyl group, octyl group, nonyl group, 2-chloroetyl group, 3-metoxyethyl group, and methoxyethoxy, ethyl group are exemplified, a lower alkyl group such as methyl group and ethyl group is preferable, and a methyl group is more preferable). More preferable is a hydrogen atom, or a lower alkyl group such as methyl group, ethyl group and n-propyl group.

The alkoxy residue which is substituted with the terminal substituent P3 is an alkyleneoxy group (for example, an alkyleneoxy group such as an ethyleneoxy group, propyleneoxy group, butyleneoxy group, pentyleneoxy group, hexyleneoxy group, and heptyleneoxy group), or an alkyleneoxy-substituted alkoxy group (for example, ethyleneoxyethoxy group).

Specific examples of the compounds represented by Formula (3) are shown below, to which, however, the present invention should not be limited.

Formula (3) is described in detail. $R^{31}$ and $R^{32}$ each are a hydrogen atom or a methyl group.

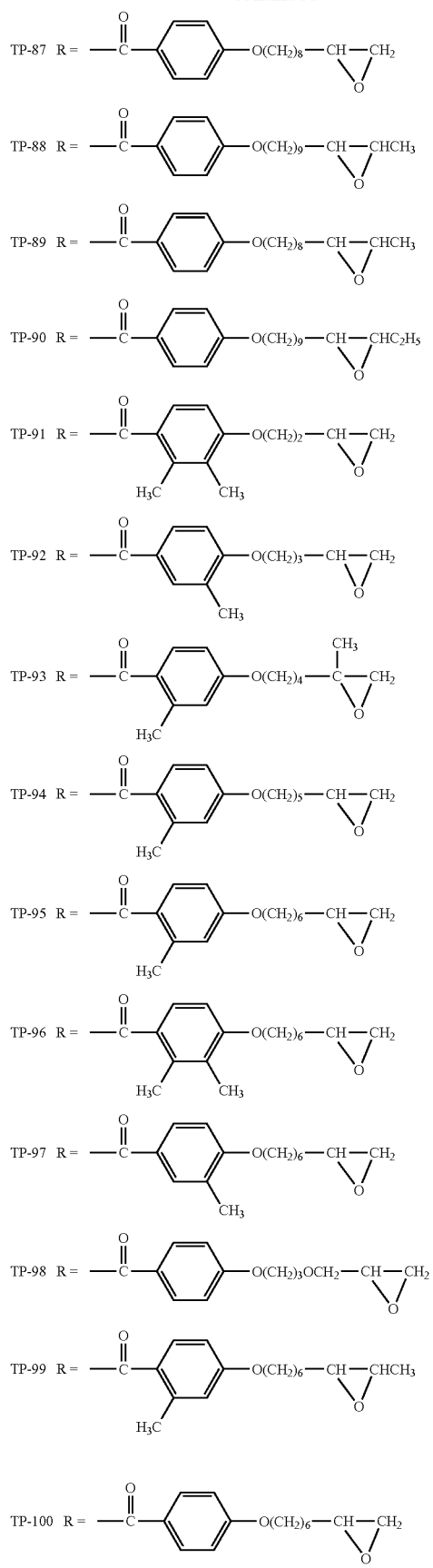

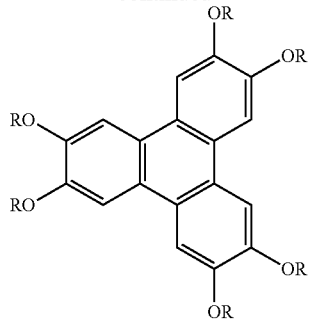

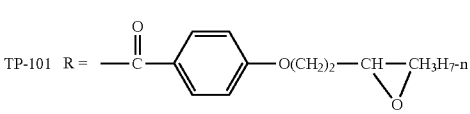

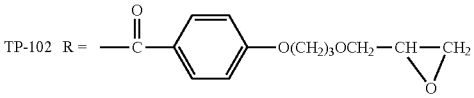

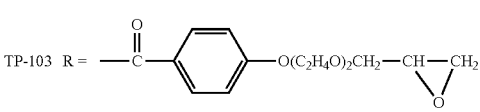

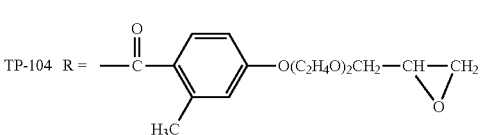

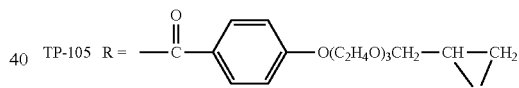

Formula (4) is described in detail. $R^{44}$ and $R^{45}$ each are a hydrogen atom or an alkyl group (for example, methyl group, ethyl group, n-propyl group, isopropyl group, n-butyl group, pentyl group, hexyl group, heptyl group, octyl group, and nonyl group are exemplified; a lower alkyl group such as methyl group and ethyl group are preferable, and a methyl group is more preferable). More preferable is a combination wherein both of $R^{44}$ and $R^{45}$ are a hydrogen atom.

$R^{46}$ is a hydrogen atom, or a substituted or unsubstituted alkyl group (methyl group, ethyl group, n-propyl group, isopropyl group, n-butyl group, pentyl group, hexyl group, heptyl group, octyl group, nonyl group, 2-chloroetyl group, 3-metoxyethyl group, and methoxyethoxyethyl group are exemplified, a lower alkyl group such as methyl group and ethyl group is preferable, and a methyl group is more preferable), preferably a hydrogen atom, or a lower alkyl group such as methyl group, ethyl group, or n-propyl group.

n is an integer of 2 to 12, preferably an integer of 2 to 8, more preferably an integer of 2 to 6.

Specific examples of the compounds represented by Formula (4) are shown below, to which, however, the present invention should not be limited.

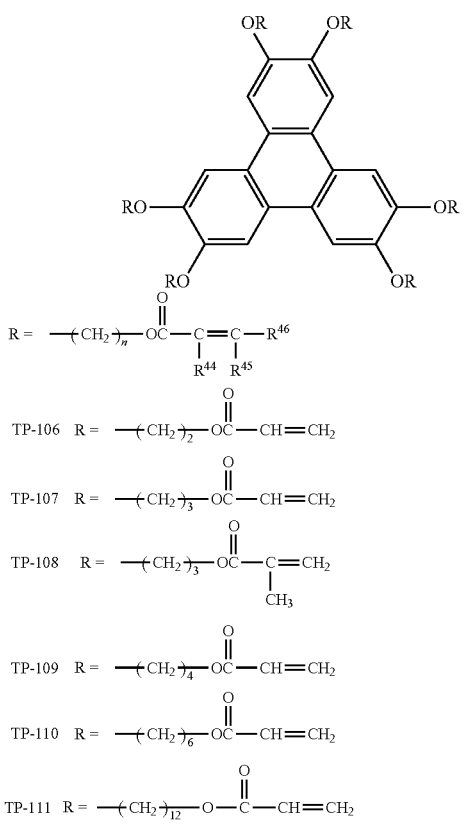

| | |
|---|---|
| TP-106 | R = —(CH$_2$)$_2$—OC(O)—CH=CH$_2$ |
| TP-107 | R = —(CH$_2$)$_3$—OC(O)—CH=CH$_2$ |
| TP-108 | R = —(CH$_2$)$_3$—OC(O)—C(CH$_3$)=CH$_2$ |
| TP-109 | R = —(CH$_2$)$_4$—OC(O)—CH=CH$_2$ |
| TP-110 | R = —(CH$_2$)$_6$—OC(O)—CH=CH$_2$ |
| TP-111 | R = —(CH$_2$)$_{12}$—O—C(O)—CH=CH$_2$ |

Other Polymerizable Monomers

The polymerizable composition of the present invention may comprise a polymerizable compound other than the above compound having a triphenylene skeleton and a polymerizable group. The polymerizable composition preferably comprises preferably a compound having two or more functional groups, more preferably a (meta)acrylate having two or more functional groups, further more preferably a (meta) acrylate having two or more functional groups and having an aromatic ring. Examples of the aromatic ring include a benzene ring, a naphthalene ring and an anthracene ring. In the present invention, the polymerizable composition still more preferably comprises a compound represented by Formula (5);

Formula (5)

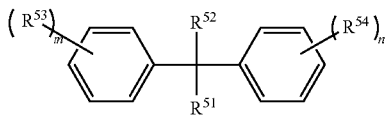

wherein $R^{51}$ and $R^{52}$ each are a hydrogen atom, an alkyl group, or an aryl group; $R^{51}$ and $R^{52}$ may bond to each other to form a ring; $R^{53}$ and $R^{54}$ each are a substituent; m and n each are an integer of 0 to 5; (m+n) is not less than 2; when m is not less than 2, each $R^{53}$ may be the same or different; when n is not less than 2, each $R^{54}$ may be the same or different; and at least two of $R^{53}$ and $R^{54}$ have a (meth)acryloyloxy group.

In Formula (5), $R^{51}$ and $R^{52}$ each are a hydrogen atom, an alkyl group, or an aryl group, $R^{51}$ and $R^{52}$ may bond to each other to form a ring. The alkyl group is preferably a methyl group. The aryl group is preferably a phenyl group. $R^{51}$ and $R^{52}$ each are more preferably a hydrogen atom, or an alkyl group. When $R^{51}$ and $R^{52}$ are an alkyl group and bond to each other to form a ring, $R^{51}$ and $R^{52}$ particularly preferably form 1,1-cyclohexylidene group. When $R^{51}$ and $R^{52}$ are an aryl group and bond to each other to form a ring, the whole of $R^{51}$ and $R^{52}$ more preferably compose a fluorene ring.

$R^{51}$ and $R^{52}$ may have a substituent. Examples of the substituent include an alkyl group (for example, methyl group, ethyl group, isopropyl group, t-butyl group, n-octyl group, n-decyl group, n-hexadecyl group, cyclopropyl group, cyclopentyl group, cyclohexyl group), an alkenyl group (for example, vinyl group, aryl group, 2-butenyl group, 3-pentenyl group), an aryl group (for example, phenyl group, p-methylphenyl group, naphthyl group, anthryl group, phenanthryl group, pyrenyl group), a halogen atom (for example, fluorine atom, chlorine atom, bromine atom, iodine atom), an acyl group (for example, acetyl group, benzoyl group, formyl group, pivaloyl group), an acyloxy group (for example, acetoxy group, acryloyloxy group, methacryloyloxy group), alkoxycarbonyl group (for example, methoxycarbonyl group, ethoxycarbonyl group), an aryloxycarbonyl group (for example, henyloxycarbonyl group), a sulfonyl group, a sulfinyl group (for example methanesulfinyl group and benzenesulfinyl group), a heterocyclic group (it preferably has 1 to 12 carbon atoms, includes a nitrogen atom, an oxygen atom, a sulfur atom, or the like as a hetero atom, and may be an aliphatic heterocyclic group, or a heteroaryl group; examples thereof include imidazolyl group, pyridyl group, quinolyl group, furyl group, thienyl group, piperidyl group, morpholino group, benzoxazolyl group, benzimidazolyl group, benzothiazolyl group, carbazolyl group, and zepinyl group). Those substituents may be thither substituted.

$R^{53}$ and $R^{54}$ each are a substituent. Examples of $R^{53}$ and $R^{54}$ include the same substituents as the above-mentioned substituent for $R^{51}$ and $R^{52}$.

m and n each are an integer of 0 to 5. When m is not less than 2, each $R^{53}$ may be the same or different. When n is not less than 2, each $R^{54}$ may be the same or different. Preferably, m and n are 1.

At least two of $R^{53}$ and $R^{54}$ in the (meth)acrylate represented by Formula (5) have a (meth)acryloyloxy group. Preferably at least one $R^{53}$ and at least one $R^{54}$ in the (meth) acrylate represented by Formula (5) have a (meth) acryloyloxy group. Examples of a group having a (meth) acryloyloxy group include acryloyloxy group, methacryloyloxy group, 2-acryloyloxyetoxy group, 2-methacryloyloxyetoxy group, 2-hydroxy-3-acryloyloxypropoxy group, 2-hydroxy-3-methacryloyloxypropoxy group, 2-octanoyloxy-3-acryloyloxypropoxy group, 2-heptanoyloxy-3-methacryloyloxypropoxy group, 2,3-bis(acryloyloxy)propoxy group, and 2,3-bis (methacryloyloxy)propoxy group.

The aromatic (meth)acrylate represented by Formula (5) is preferably an aromatic (meth)acrylate represented by Formula (6);

Formula (6)

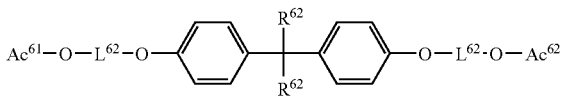

wherein $R^{61}$ and $R^{62}$ each are a hydrogen atom, an alkyl group, or an aryl group; $L^{61}$ and $L^{62}$ each are a linking group; $Ac^{61}$ and $Ac^{62}$ each are an acryloyl group, or a methacryloyl group.

The preferable range of $R^{61}$ and $R^{62}$ is the same as those of $R^{51}$ and $R^{52}$.

$L^{61}$ and $L^{62}$ each are a linking group. Examples thereof include an alkylene group (for example, ethylene group, 1,2-propylene group, 2,2-propylene group (which may be referred as 2,2-propylidene group, or 1,1-dimethylmethylene), 1,3-propylene group, 2,2-dimethyl-1,3-propylene group, 2-butyl-2-ethyl 1,3-propylene group, 1,6-hexylene group, 1,9-nonilene group, 1,12-dodecylene group, and 1,16-hexadecylene), an arylene group (for example, phenylene group, and naphthylene group), an ether group, an imino group, a carbonyl group, a sulfonyl group, and a divalent residue formed by bonding plurality of those divalent linking groups in series (for example, polyethylene oxyethylene group, polypropylene oxypropylene group, 2,2-propylene phenylene group). $L^{61}$ and $L^{62}$ may have a substituent. Examples of the substituent which substituent $L^{61}$ or $L^{62}$ include the same groups as the substituent for $R^{61}$ and $R^{62}$ as mentioned above. Those substituents further may be substituted. Of those, preferable is an alkylene group, an arylene group, or a divalent group formed by bonding a plurality thereof in series.

The molecular weight of the aromatic (meth)acrylate represented by Formula (5) is 300 to 1000, preferably 400 to 800. Two or more aromatic (meth)acrylate represented by Formula (5) may be contained in the polymerizable composition. The acryl equivalent weight of the aromatic (meth)acrylate represented by Formula (5) is preferably 180 to 360, more preferably 210 to 330.

Specific examples of the aromatic (meth)acrylate represented by Formula (5) are shown below, to which, however, the present invention should not be limited

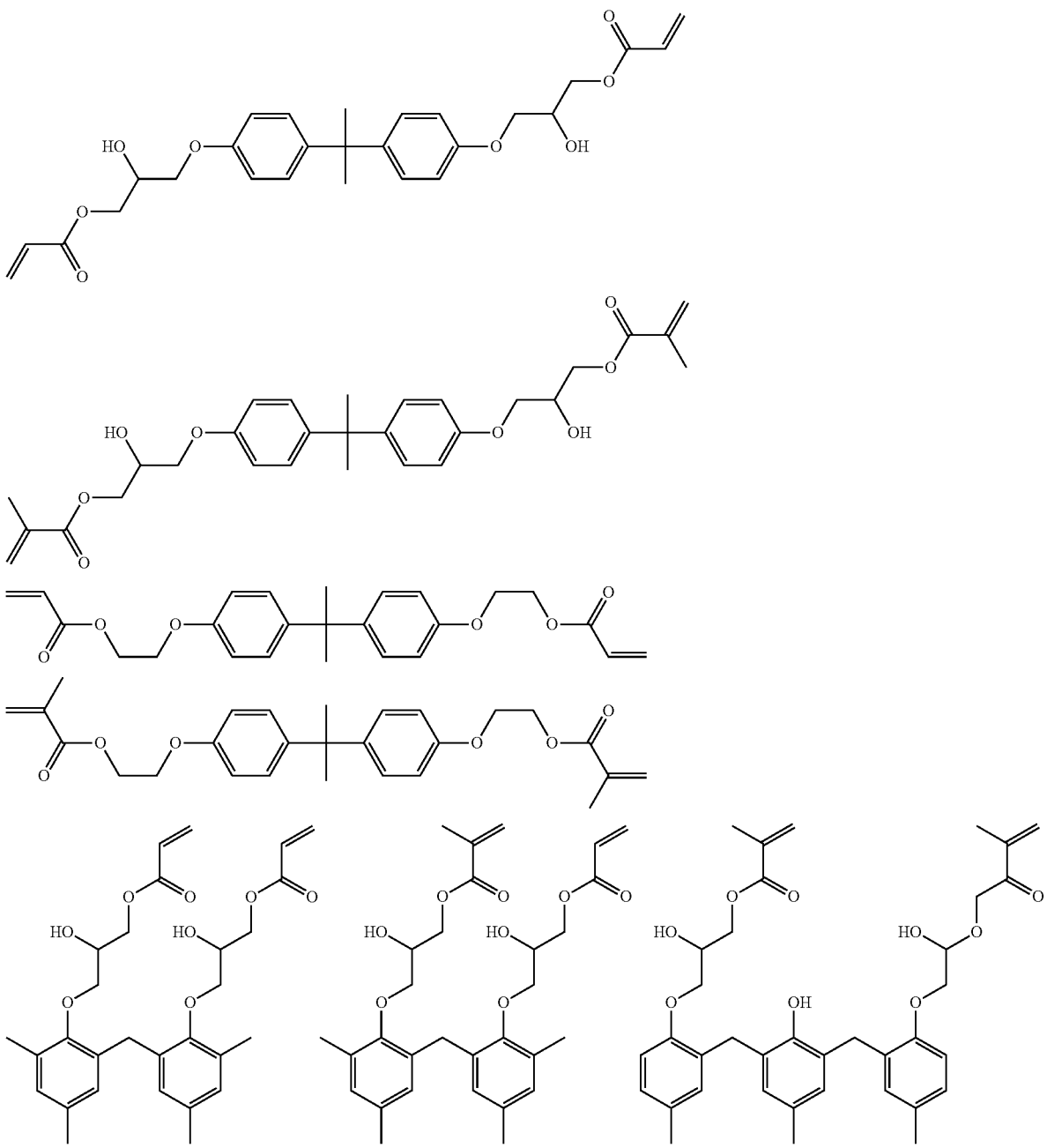

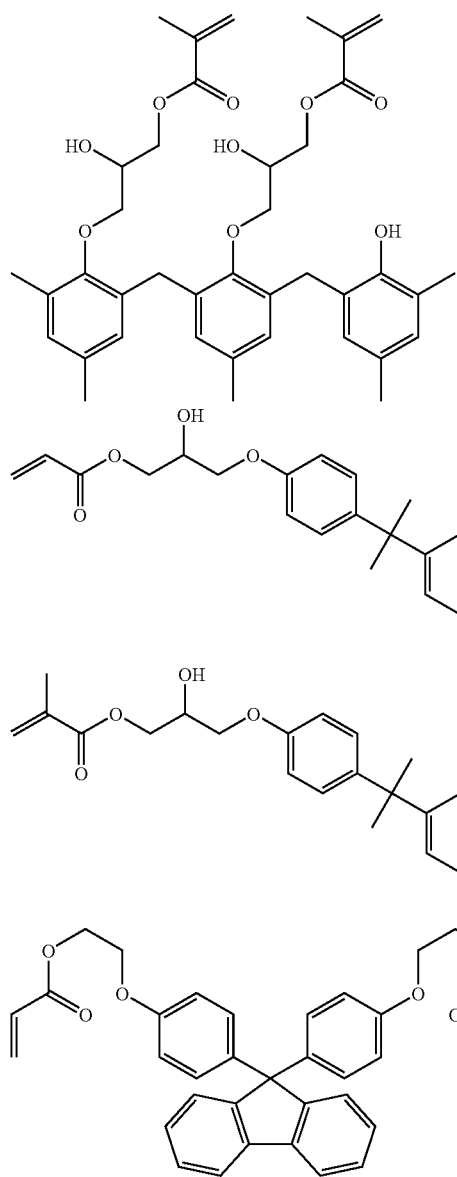
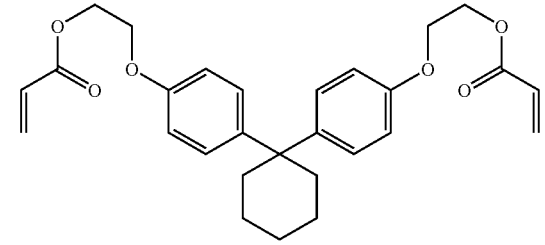
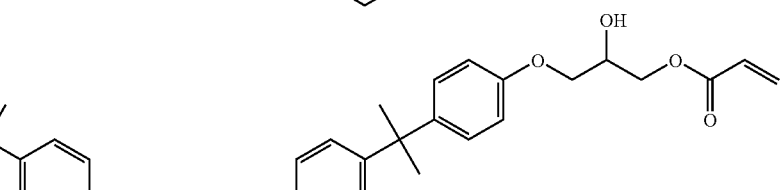
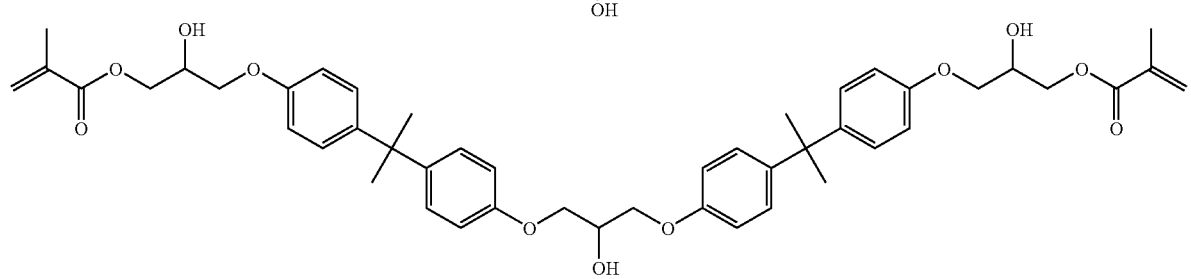
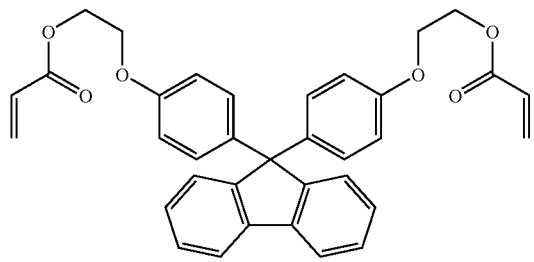

(Acidic Monomers)

The polymerizable composition in the present invention may comprise an acidic monomer. By adding such an acidic monomer, adhesion between layers of the obtained bather laminate is improved. The acidic monomer means a monomer comprising an acidic group such as a carboxylic group, a sulfonic group, a phosphoric group, or phosphonate group. The acidic monomer in the present invention is preferably a monomer comprising a carboxylic group or a phosphoric group, more preferably a (meta)acrylate comprising a carboxylic group or a phosphoric group, further more preferably a (meta)acrylate comprising a phosphoester group.

((Meth)acrylate Having a Phosphoester Group)

The polymerizable composition comprise preferably a (meth)acrylate having a phosphoester group, more preferably a compound represented by Formula (P). The inclusion of the (meth)acrylate compound having a phosphorester group improves the adhesion to the inorganic layer;

Formula (P)

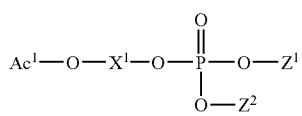

wherein $Z^1$ represents $Ac^2$—O—$X^2$—, a substituent group not having a polymerizable group, or a hydrogen atom, $Z^2$ represents $Ac^3$—O—$X^3$—, a substituent group not having a polymerizable group, or a hydrogen atom, $Ac^1$, $Ac^2$ and $Ac^3$ each represent an acryloyl group or a methacryloyl group, and $X^1$, $X^2$ and $X^3$ each represent a divalent linking group.

The compound represented by Formula (P) is preferably a monofunctional monomer represented by Formula (P-1), a bifunctional monomer represented by Formula (P-2) or a trifunctional monomer represented by Formula (P-3);

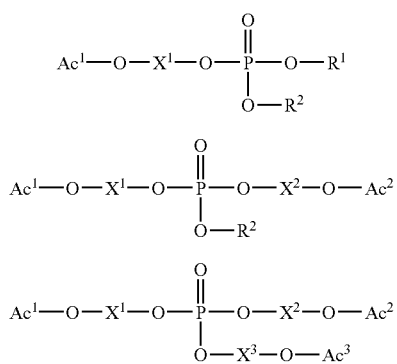

Formula (P-1)

Formula (P-2)

Formula (P-3)

The definitions of $Ac^1$, $Ac^2$, $Ac^3$, $X^1$, $X^2$ and $X^3$ are the same as those in Formula (P). In Formula (P-1) and Formula (P-2), $R^1$ represents a substituent not having a polymerizable group, or a hydrogen atom, and $R^2$ represents a substituent group not having a polymerizable group, or a hydrogen atom.

In Formulae (P), and (P-1) to (P-3), $X^2$ and $X^3$ each are the same definition as $L^{62}$ in Formula (6). $X^1$, $X^2$ and $X^3$ each are preferably an alkylene group, or an alkyleneoxycarbonylalkylene group.

In Formulae (P), and (P-1) to (P-3), examples of the substituent not having a polymerizable group include an alkyl group, an aryl group, and a group obtained by combining them. More preferable is an alkyl group.

The carbon number of the alkyl group is preferably 1 to 12, more preferably 1 to 9, still more preferably 1 to 6. Examples of the alkyl group include a methyl group, an ethyl group, a propyl group, a butyl group, a pentyl group and a hexyl group. The alkyl group may be a linear, branched, or cyclic group, and preferably a linear alkyl group. The alkyl group may be substituted with an alkoxy group, an aryl group, an aryloxy group, or the like.

The carbon number of the aryl group is preferably 6 to 14, more preferably 6 to 10. Examples of the aryl group include phenyl group, 1-naphthyl group, and 2-naphtyl group. The aryl group may be substituted with an alkyl group, an alkoxy group, an aryloxy group, and the like.

In the present invention, the monomer represented by Formula (P) may be used singly or as combined. When the compounds are used as combined, may be used a combination comprising two or more kinds of a monofunctional compound represented by Formula (P-1), a bifunctional compound represented by Formula (P-2) and a trifunctional compound represented by Formula (P-3).

In the present invention, as the above polymerizable monomers having a phosphate group, may be used commercially available compounds such as KAYAMER series manufactured by NIPPON KAYAKU CO., LID, and Phosmer series manufactured by Uni chemical, and a compound newly synthesized.

Specific examples of the acidic monomer, which is preferably used in the present invention, mentioned below, to which, however; the present invention should not be limited.

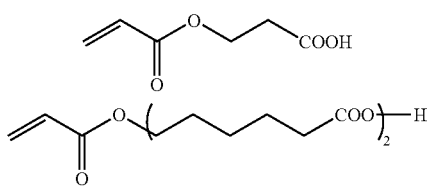

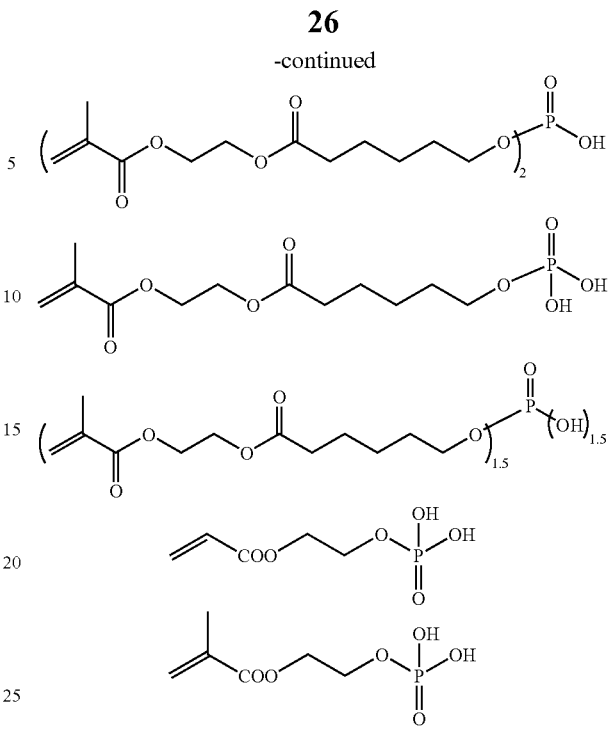

The polymerizable composition in the present invention may comprise a compound having a triphenylene skeleton and a polymerizable group (for example, compounds represented by Formulae (1) to (3)) and other compounds (for example, a (meta)acrylate compound having bifunctional or more functional groups and having an aromatic ring) in the ratio by weight of 10:90 to 99:1, preferably 20:80 to 80:20. When an acidic monomer is added, the ratio by weight of a compound having a triphenylene skeleton and a polymerizable group, a (meta)acrylate compound having bifunctional or more functional groups and having an aromatic ring and an acidic monomer is preferably 10 to 98:1 to 89:1 to 30, more preferably 20 to 78:20 to 78:2 to 15.

(Polymerization Initiator)

The polymerizable composition in the present invention may include a polymerization initiator. When a photopolymerization initiator is used, its amount is preferably at least 0.1 mol % of the total amount of the polymerizable compound, more preferably from 0.5 to 2 mol %. By setting the thus-designed composition, polymerization reaction though an active ingredient forming reaction may be suitably controlled. Examples of the photopolymerization initiator include Ciba Speciality Chemicals' commercial products, Irgacure series (e.g., Irgacure 651, Irgacure 754, Irgacure 184, Irgacure 2959, Irgacure 907, Irgacure 369, Irgacure 379, Irgacure 819), Darocure series (e.g., Darocure TPO, Darocure 1173), Quantacure PDO; Lambeth's commercial products, Ezacure series (e.g., Ezacure TZM, Ezacure TZT, Ezacure KTO46) etc.

(Method of Formation of Organic Layer)

The method for forming the organic layer is not specifically defined. For example, the layer may be fanned according to known coating methods such as a solution coating method and a vacuum film formation method. The solution coating method is, for example, a dipping method, an air knife coating method, a curtain coating method, a roller coating method, a wire bar coating method, a gravure coating method, a slide coating method, or an extrusion coating method using a hopper as in U.S. Pat. No. 2,681,294. The vacuum film formation method is not specifically defined, but is preferably a film formation method by vapor deposition or plasma CVD. In the present invention, the polymer may be applied for coating as its solution, or a hybrid coating method along with an inorganic material, as in JP-A 2000-323273 and 2004-25732, may also be used.

In the present invention, the polymerizable composition is exposed to light for curing, and the light for exposure is generally a UV my from a high-pressure mercury lamp or low-pressure mercury lamp. The radiation energy is preferably at least 0.1 J/cm$^2$, more preferably at least 0.5 J/cm$^2$. Acrylate and methacrylate may suffer from interference in polymerization owing to oxygen in air, and therefore, in their polymerization, the oxygen concentration or the oxygen partial pressure is preferably lowered. When the oxygen concentration in polymerization is lowered according to a nitrogen purging method, the oxygen concentration is preferably at most 2%, more preferably at most 0.5%. When the oxygen partial pressure in polymerization is lowered by a pressure reduction method, the whole pressure is preferably at most 1000 Pa, more preferably at most 100 Pa. Especially preferable is UV polymerization with at least 0.5 J/cm$^2$ energy radiation under a condition of reduced pressure of at most 100 Pa.

The organic layer is preferably smooth and having a hard surface. The mean surface roughness (Ra) in 1 µm$^2$ of the organic layer is preferably less than 1 nm, more preferably less than 0.5 nm. Preferably, the rate of polymerization of monomer is at least 85%, more preferably at least 88%, even more preferably at least 90%, still more preferably at least 92%. The rate of polymerization as referred to herein means the ratio of the reacted polymerizable group to all the polymerizable group (acryloyl group and methacryloyl group) in the monomer mixture. The rate of polymerization may be quantitatively determined according to IR absorptiometry.

The thickness of the organic layer is not specifically defined. However, when the layer is too thin, then its thickness could hardly keep uniformity; but when too thick, the layer may be cracked by external force applied thereto and its bather-property may lower. From these viewpoints, the thickness of the organic layer is preferably from 50 nm to 2000 nm, more preferably from 200 nm to 1500 nm.

As so mentioned in the above, the organic layer is preferably smooth. The surface of the organic layer is required not to have impurities and projections such as particles. Accordingly, it is desirable that the organic layer is formed in a clean room. The degree of cleanness is preferably at most class 10000, more preferably at most class 1000.

Preferably, the hardness of the organic layer is higher. It is known that, when the hardness of the organic layer is high, then the inorganic layer may be formed smoothly and, as a result, the barrier level of the gas barrier film is thereby improved. The hardness of the organic layer may be expressed as a microhardness based on a nano-indentation method. The microhardness of the organic layer is preferably at least 100 N/mm, more preferably at least 150 N/mm.

(Inorganic Layer)

The inorganic layer is, in general, a layer of a thin film formed of a metal compound. For forming the inorganic layer, employable is any method capable of producing the intended thin film. For it, for example, suitable are physical vapor deposition (PVD) such as vapor evaporation process, sputtering process, ion plating process; various chemical vapor deposition (CVD); liquid phase growth process such as plating or sol-gel process. In the present invention, when the inorganic layer is formed by a sputtering process, the produced barrier laminate also has high barrier property. Not specifically defined, the component to be in the inorganic layer may be any one satisfies the above-mentioned requirements. Examples of the components include metal oxides, metal nitrides, metal carbides, metal oxinitrides and metal oxicabides. Preferable are oxides, nitrides, carbides, oxinitrides or oxicarbides comprising at least one metal selected from Si, Al, In, Sn, Zn, Ti, Cu, Ce and Ta. Of those, preferable are oxides, nitrides or oxinitrides of a metal selected from Si, Al, In, Sn, Zn and Ti; more preferable are metal oxides, nitrides or oxinitrides with Si or Al. These may comprise any other element as a subsidiary component.

Preferably, the surface smoothness of the inorganic layer formed in the present invention is less than 1 nm in terms of the mean surface roughness (Ra value) in 1 µm square, more preferably at most 0.5 nm. It is desirable that the inorganic layer is formed in a clean room. Preferably, the degree of cleanness is at most class 10000, more preferably at most class 1000.

Not specifically defined, the thickness of the inorganic layer is generally within a range of from 5 to 500 nm/layer, preferably within a range of from 10 to 200 nm/layer. Two or more inorganic sublayers may be laminated. In this case, the constitutive layers may have the same composition or may have different compositions. The boundary between the organic layer and the inorganic layer may be unclear and the composition may continuously change in the thickness direction as shown in US 2004/46497.

(Lamination of Organic Layer and Inorganic Layer)

The organic layer and the inorganic layer may be laminated by repeated film formation to form the organic layer and the inorganic layer in a desired layer constitution. When the inorganic layer is formed according to a vacuum film formation process such as sputtering process, vacuum evaporation process, ion plating process or plasma CVD, then it is desirable that the organic layer is also formed according to a vacuum film formation process such as the above-mentioned flash vapor deposition process. While the barrier layer is formed, it is especially desirable that the organic layer and the inorganic layer are laminated all the lime in a vacuum of at most 1000 Pa, not restoring the pressure to an atmospheric pressure during the film formation. More preferably, the pressure is at most 100 Pa, even more preferably at most 50 Pa, still more preferably at most 20 Pa.

Particularly, the barrier laminate of the present invention shows improved barrier property when it has an alternately laminated structure of at least two organic layers and at least two inorganic layers. The alternative laminate is preferably that an organic layer/an inorganic layer/an organic layer/an inorganic layer are laminated on a substrate in this order.

(Functional Layer)

The bather laminate of the present invention may have a functional layer on the barrier laminate or in any other position. The functional layer is described in detail in JP-A 2006-289627, paragraphs 0036 to 0038. Examples of other functional layers than those are a matting agent layer, a protective layer, a solvent-resistant layer, an antistatic layer, a smoothening layer, an adhesiveness improving layer, a light shielding layer, an antireflection layer, a hard coat layer, a stress relaxing layer, an antifogging layer, an anti-soiling layer, a printable layer, an adhesive layer, etc.

(Use of Bather Laminate)

In general, the bather laminate of the present invention is formed on a support. Selecting the support, the barrier laminate may have various applications. The support includes a substrate film, as well as various devices, optical members, etc. Concretely, the barrier laminate of the present invention may be used as a barrier layer of a gas bather film. The barrier laminate and the gas bather film of the present invention may be used for sealing up devices that require gas bather performance. The bather laminate and the gas bather film of the present invention may apply optical members. These are described in detail hereinunder.

<Gas Bather Film>

The gas bather film comprises a substrate film and a bather laminate formed on the substrate film. In the gas bather film, the bather laminate of the present invention may be provided only one surface of the substrate film, or may be provided on both surfaces thereof. The uppermost layer of the laminate of the present invention may be an inorganic layer or an organic layer.

The gas barrier film of the present invention is a film substrate having a barrier layer that functions to block oxygen, water, nitrogen oxide, sulfur oxide, ozone and others in air.

Not specifically defined, the number of the layers that constitute the gas bather film may be typically from 2 layers to 30 layers, more preferably from 3 layers to 20 layers.

The gas bather film may have any other constitutive components (e.g., functional layers such as adhesive layer) in addition to the bather laminate and the substrate film. The functional layer may be disposed on the bather laminate, or between the bather laminate and the substrate film, or on the side (back) of the substrate film not coated with the bather laminate.

(Plastic Film)

In the gas bather film of the present invention, the substrate film is generally a plastic film. Not specifically defined in point of the material and the thickness thereof, the plastic film usable herein may be any one capable of supporting a laminate of an organic layer and an inorganic layer, and it may be suitably selected depending on the use and the object thereof. Concretely, the plastic film includes thermoplastic resins such as polyester resin, methacryl resin, methacrylic acid-maleic anhydride copolymer, polystyrene resin, transparent fluororesin, polyimide, fluoropolyimide resin, polyamide resin, polyamidimide resin, polyetherimide resin, cellulose acylate resin, polyurethane resin, polyether ether ketone resin, polycarbonate resin, alicyclic polyolefin resin, polyarylate resin, polyether sulfone resin, polysulfone resin, cycloolefin copolymer, fluorene ring-modified polycarbonate resin, alicyclic-modified polycarbonate resin, fluorene ring-modified polyester resin, acryloyl compound.

When the gas barrier film of the present invention is used as a substrate of a device such as an organic EL device to be mentioned hereinunder, it is desirable that the plastic film is formed of a heat-resistant material. Concretely, the plastic film is preferably formed of a heat-resistant transparent material having a glass transition temperature (Tg) of not lower than 100° C. and/or a linear thermal expansion coefficient of at least 40 ppm/° C. Tg and the linear expansion coefficient may be controlled by the additives to the material. The thermoplastic resin of the type includes, for example, polyethylene naphthalate (PEN: 120° C.), polycarbonate (PC: 140° C.), alicyclic polyolefin (e.g., Nippon Zeon's Zeonoa 1600: 160° C.), polyarylate (PAr: 210° C.), polyether sulfone (PES: 220° C.), polysulfone (PSF: 190° C.), cycloolefin copolymer (COC, compound described in JP-A 2001-150584: 162° C.), polyimide (Mitsubishi gas chemical company's Neopulim: 260° C.), fluorene ring-modified polycarbonate (BCF—PC, compound described in JP-A 2000-227603: 225° C.), alicyclic-modified polycarbonate (IP-PC, compound described in JP-A 2000-227603: 205° C.), acryloyl compound (compound described in JP-A 2002-80616: 300° C. or more) (the parenthesized data are Tg). In particular, for high transparency, use of alicyclic polyolefin is preferable.

In the case where the gas barrier film of the present invention is used in combination with a polarizing plate, it is preferable that the gas barrier layer surface of the gas bather film is faced at the inside of a cell and is disposed in the innermost (adjacent to the device). At that time, since the gas barrier film is disposed in the inside of the cell relative to the polarizing plate, a retardation value of the gas bather film is important. As to a use form of the gas bather film in such an embodiment, it is preferable that a barrier film using a base material film having a retardation value of not more than 10 nm and a circular polarizing plate ((quarter-wave plate)+(half-wave plate)+(linear polarizing plate)) are laminated and used, or that a linear polarizing plate is combined with a gas bather film using a base material film having a retardation value of from 100 nm to 180 nm, which can be used as a quarter-wave plate, and used.

Examples of the base material film having a retardation of not more than 10 nm include cellulose taiacetate (FUJTTAC, manufactured by Fujifilm Corporation), polycathonates (PURE-ACE, manufactured by Teijin Chemicals Ltd.; and ELMECH, manufactured by Kaneka Corporation), cycloolefin polymers (ARTON, manufactured by JSR Corporation; and ZEONOR, manufactured by Zeon Corporation), cycloolefin copolymers (APEL (pellet), manufactured by Mitsui Chemicals, Inc.; and TOPAS (pellet), manufactured by Polyplastics Co., Ltd.), polyarylates (U100 (pellet), manufactured by Unitika Ltd.) and transparent polyimides (NEOPULIM, manufactured by Mitsubishi Gas Chemical Company).

Also, films obtained by properly stretching the foregoing film to adjust it so as to have a desired retardation value can be used as the quarter-wave plate.

When the gas barrier film of the present invention is used in devices such as organic EL devices, the plastic film is transparent, or that is, its light transmittance is generally at least 80%, preferably at least 85%, more preferably at least 90%. The light transmittance may be measured according to the method described in HS-10105. Concretely, using an integrating sphere-type light transmittance meter, a whole light transmittance and a quantity of scattered light are measured, and the diffusive transmittance is subtracted from the whole transmittance to obtain the intended light transmittance of the sample.

Even when the gas barrier film of the present invention is used in displays, it does not always require transparency in a case where it is not disposed on the viewers' side. Accordingly in such a case, a nontransparent material may be used for the plastic film. The nontransparent material includes, for example, polyimide, polyacrylonitrile, known liquid-crystal polymer.

Not specifically defined, the thickness of the plastic film for use in the gas bather film of the present invention may be suitably selected depending on its use. Typically, the thickness may be from 1 to 800 μm, preferably from 10 to 200 μm. The plastic film may have a functional layer such as a transparent conductive layer, a primer layer, etc. The functional layer is described in detail in JP-A2006-289627, paragraphs 0036 to 0038.

<Device>

The barrier laminate and the gas barrier film of the present invention are favorably used for devices that are deteriorated by the chemical components in air (e.g., oxygen, water, nitrogen oxide, sulfur oxide, ozone). Examples of the devices are, for example, organic EL devices, liquid-crystal display devices, thin-film transistors, touch panels, electronic papers, solar cells, other electronic devices. More preferable are organic EL devices.

The bather laminate of the present invention may be used for film-sealing of devices. Specifically, this is a method of providing a barrier laminate of the present invention on the surface of a device serving as a support by itself. Before providing the bather laminate, the device may be covered with a protective layer.

The gas bather film of the present invention may be used as a substrate of a device or as a film for sealing up according to a solid sealing method. The solid sealing method comprises forming a protective layer on a device, then forming an adhesive layer and a gas barrier film as laminated thereon, and curing it Not specifically defined, the adhesive may be a thermosetting epoxy resin, a photocurable acrylate resin, etc.

(Organic EL Device)

Examples of an organic EL device with a gas barrier film are described in detail in JP-A 2007-30387.

(Liquid-Crystal Display Device)

A reflection-type liquid-crystal display device has a constitution of a lower substrate, a reflection electrode, a lower alignment film, a liquid-crystal layer, an upper alignment film, a transparent electrode, an upper substrate, a λ/4 plate and a polarizing film, formed in that order from the bottom. In this, the gas bather film of the present invention may be used as the transparent electrode substrate and the upper substrate. In color displays, it is desirable that a color filter layer is additionally provided between the reflection electrode and the lower alignment film, or between the upper alignment film and the transparent electrode. A transmission-type liquid-crystal display device has a constitution of a backlight, a polarizer, a λ/4 plate, a lower transparent electrode a lower alignment film, a liquid-crystal layer, an upper alignment film, an upper transparent electrode, an upper substrate, a λ/4 plate and a polarizing film, formed in that order from the bottom. In this, the substrate of the present invention may be sued as the upper transparent electrode and the upper substrate. In color displays, it is desirable that a color filter layer is additionally provided between the lower transparent electrode and the lower alignment or between the upper alignment film and the transparent electrode. Not specifically defined, the type of the liquid-crystal cell is preferably a TN (twisted nematic) type, an STN (super-twisted nematic) type, a MAN (hybrid aligned nematic) type, a VA (vertically alignment) type, an ECB (electrically controlled birefringence) type, an (CCB (optically compensatory bent) type, a CPA (continuous pinwheel alignment) type, or an IPS (in-plane switching) type.

(Solar Cell)

The gas barrier film of the present invention can be used also as a sealing film for solar cell devices. Preferably, the gas barrier film of the present invention is used for sealing a solar cell device in such a manner that its adhesive layer is on the side near to the solar cell device. The solar cell devices for which the gas barrier film of the present invention is favorably used are not specifically defined. For example, they include single crystal silicon-based solar cell devices, polycrystalline silicon-based solar cell devices, single junction or tandem-structure amorphous silicon-based solar cell devices, gallium-arsenic (GaAs), indium-phosphorus (InP) or the like Group compound semiconductor-based solar cell devices, cadmium-tellurium (CdTe) or the like II-VI Group compound semiconductor-based solar cell devices, copper/indium/selenium (CIS-based), copper/indium/gallium/selenium (CIGS-based), copper/indium/gallium/selenium/sulfur (CIGSS-based) or the like I-III-VI Group compound semiconductor-based solar cell devices, dye-sensitized solar cell devices, organic solar cell devices, etc. Above all, in the present invention, the solar cell devices are preferably copper/indium/selenium (CIS-based), copper/indium/gallium/selenium (CIGS-based), copper/indium/gallium/selenium/sulfur (CIGSS-based) or the like I-III-VI Group compound semi-conductor-based solar cell devices.

(Electronic Paper)

The gas bather Elm of the present invention can be used in an electronic paper. The electronic paper is a reflection-type electronic display capable of attaining a high precision and a high contrast.

The electronic paper has a display media and a TFT driving the display media on a substrate. Any known display media can be used in the electronic paper. For example, any display media of electophoretic-type, electopowder flight-type, charged tonner-type, electrochromic type can be preferably used. Among them, electrophoretic display media is more preferable and microcapsule-type electophoretic display media is particularly preferable. The electrophoretic display media has a plural number of capsules and each capsule has at least one particle capable of moving in a suspension flow. The at least one particle is preferably an electrophoretic particle or a spinning ball. The electrophoretic display media has a first plane and a second plane that are placed in parallel, and an image is displayed through one of the two planes.

A TFT formed on a substrate comprises a gate electrode, gate insulating layer, an active layer, a source electrode and a drain electrode. A TFT also comprises a resistance layer between the active layer and the source electrode and/or between the active layer and the drain electrode to attain electric connection.

When a color display with a high precision is produced, TFTs are preferably formed on a color filter to precisely align them. Normal TFT with a low electric efficiency can not be down-sized much white obtaining the necessary driving current, and when a high precision display is pursued, the rate of the area for the TFT in a pixel must be high. When the rate of the area for the TFT is high, the rate of the opening area and contrast are low.

Even when a transparent amorphous IGZO-type TFT is used, light transmittance is not 100% and reduction of contrast is unavoidable. Use of the TFT disclosed in JP-A 2009-21554 and the like can reduce the rate of the TFT in a pixel and improve the rate of the opening area and contrast. High precision can also be attained by forming this type of TFT on a color filter directly.

(Others)

Other applications of the present invention are thin-film transistors as in JP-T H10-512104, and touch panels as in JP-A 5-127822, 2002-48913.

<Optical Member>

An example of the optical member that comprises the barrier laminate of the present invention is a circular polarizer.

(Circular Polarizer)

Laminating a gas bather film of the present invention with a λ/4 plate and a polarizer gives a circular polarizer. In this case, the components are so laminated that the slow axis of the λ/4 plate could cross the absorption axis of the polarizer at an angle of 45°. The polarizer is preferably stretched in the direction of 45° from the machine direction (MD) thereof; and for example, those described in JP-A 2002-865554 are favorably used.

EXAMPLES

The characteristics of the present invention are described more concretely with reference to the following Examples. In the following Examples, the material used, its amount and the ratio, the details of the treatment and the treatment process may be suitably modified or changed. Accordingly, the present invention should not be limitatively interpreted by the Examples mentioned below.

(Formation of Gas Bather Films (1))

On a polyethylene naphthalate film (manufactured by Teijin DuPont, Teonex Q65FA, having a thickness of 100 μm), a composition comprising a polymerizable compound shown in the following Table (the total amount is 14 weight parts), the polymerization initiator (Sartmer, Esacure KTO46, the amount is 1 weight part) and 2-butanone (the amount is 185 weight part) was coated, and cured through irradiation with UV rays at a dose of 0.5 J/cm$^2$ in atmosphere having 100 ppm of oxygen, thereby producing an organic layer. The thickness of the organic layer was 500 nm. Then, Aluminum oxide (an inorganic layer) was deposited on the surface of the formed organic layer according to a vacuum sputtering process (a radical sputtering process) to form a layer having thickness of 40 nm, thereby producing a gas barrier film. The obtained gas barrier film was tested and evaluated for the barrier property (Water Vapor Permeability) and the mean surface roughness (Ra) according to the test methods below.

[Water Vapor Permeability According to Ca Method (g/m$^2$/day)(Barrier Property)]

The water vapor permeability was measured according to the method described in G. NISATO, P. C. P. BOUTEN, P. J. SLIKKERVEER, et al.; SID Conference Record of the International Display Research Conference 1435-1438. The water vapor permeability (g/m$^2$/day) was measured at 40° C. and 90% relative humidity (RH).

[Mean Surface Roughness (Ra)]

The mean surface roughness in 1 μm$^2$ of the gas barrier film was measured using the Atomic Force Microscope (AFM). The measured mean surface roughness was evaluated and the results are shown in below Table 1.

TABLE 1

| | Organic Layer | | | | Thickness | Barrier Property | Ra of inorganic layer (Ra) |
|---|---|---|---|---|---|---|---|
| | Polymerizable Compound 1 | | Polymerizable Compound 2 | | | | |
| | Type | Amount | Type | Amount | (nm) | (g/m²/day) | (nm) |
| Comparative Example 1 | B-1 | 100 | — | — | 500 | 5.7e$^{-3}$ | 1.96 |
| Example 1 | TP-53 | 100 | — | — | 500 | 8.3e$^{-4}$ | 1.21 |
| Example 2 | TP-107 | 100 | | | 500 | 8.8e$^{-4}$ | 1.34 |
| Example 3 | TP-53 | 70 | B-1 | 30 | 500 | 4.4e$^{-4}$ | 0.52 |
| Example 4 | TP-53 | 70 | B-2 | 30 | 500 | 3.5e$^{-4}$ | 0.33 |
| Example 5 | TP-53 | 70 | B-3 | 30 | 500 | 6.5e$^{-4}$ | 0.90 |
| Example 6 | TP-53 | 70 | B-4 | 30 | 500 | 6.6e$^{-4}$ | 0.91 |
| Example 7 | TP-53 | 70 | B-5 | 30 | 500 | 5.4e$^{-4}$ | 0.69 |
| Example 8 | TP-53 | 70 | B-6 | 30 | 500 | 4.7e$^{-4}$ | 0.57 |
| Example 9 | TP-53 | 90 | B-2 | 10 | 500 | 6.8e$^{-4}$ | 0.94 |
| Example 10 | TP-53 | 80 | B-2 | 20 | 500 | 5.0e$^{-4}$ | 0.60 |
| Example 11 | TP-53 | 60 | B-2 | 40 | 500 | 3.6e$^{-4}$ | 0.36 |
| Example 12 | TP-53 | 40 | B-2 | 60 | 500 | 5.1e$^{-4}$ | 0.64 |
| Example 13 | TP-53 | 30 | B-2 | 70 | 500 | 6.9e$^{-4}$ | 0.95 |
| Comparative Example 2 | — | — | B-2 | 100 | 500 | 4.8e$^{-3}$ | 1.65 |
| Comparative Example 3 | — | — | B-3 | 100 | 500 | 6.0e$^{-3}$ | 2.01 |
| Example 14 | TP-107 C-1 | 70 5 | B-2 | 25 | 500 | 3.4e$^{-4}$ | 0.31 |
| Example 15 | TP-53 C-1 | 70 5 | B-2 | 25 | 500 | 3.2e$^{-4}$ | 0.30 |

In the above table, the mixture ratio of the polymerizable compounds in the organic layer is shown by "% by weight". In Example 14 and 15, the following Compound C-1 was added. The polymerizable compounds used in the above table are shown below.

Compound TP-53:

Compound TP-107:

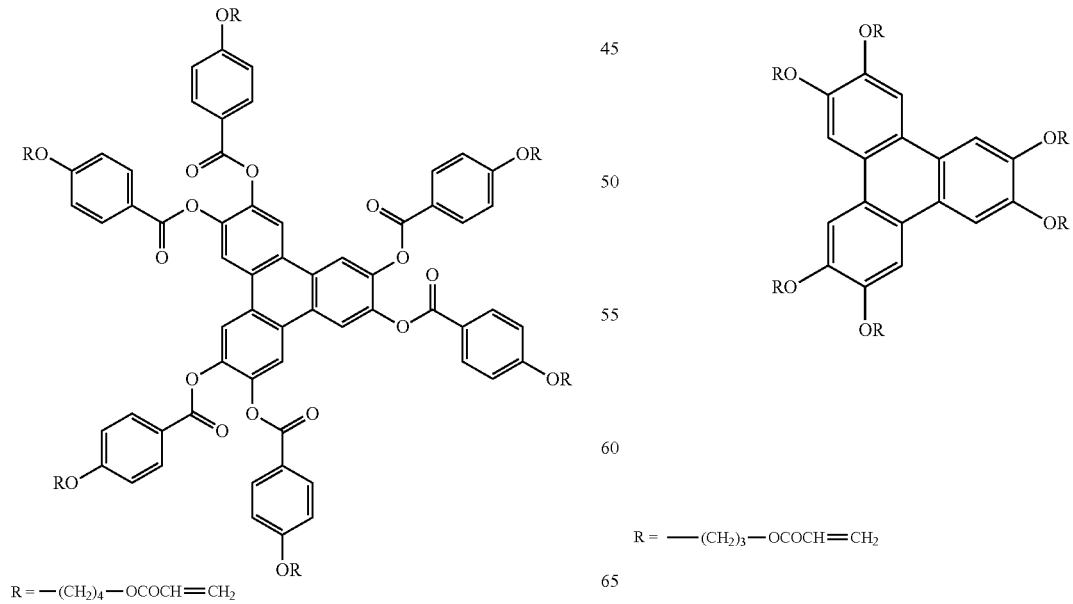

$R = -(CH_2)_4-OCOCH=CH_2$ $R = -(CH_2)_3-OCOCH=CH_2$

Compound B-1: manufactured by Shin-Nakamura Chemical. Co., Ltd., NK ester, ABE-300

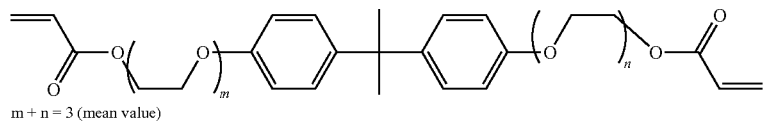
m + n = 3 (mean value)

Compound B-2: manufactured by Shin-Nakamura Chemical Co., Ltd., NK ester, A-BPEF

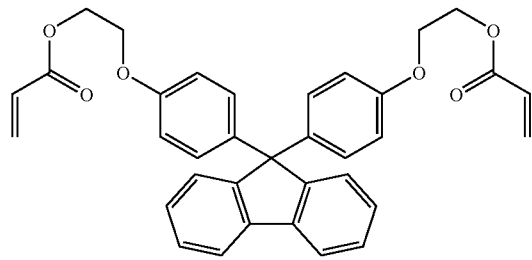

Compound B-3: manufactured by DAICEL-CYTEC COMPANY LTD., TMPTA

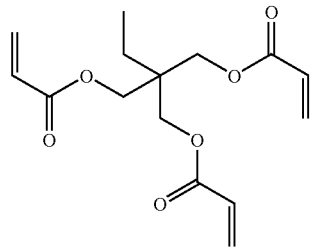

Compound B-4: manufactured by DAICEL-CYTEC COMPANY LTD., EBECRYL 140

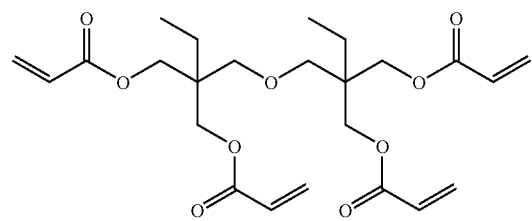

Compound B-5: manufactured by Nippon Kayaku Co., Ltd., DPCA-20

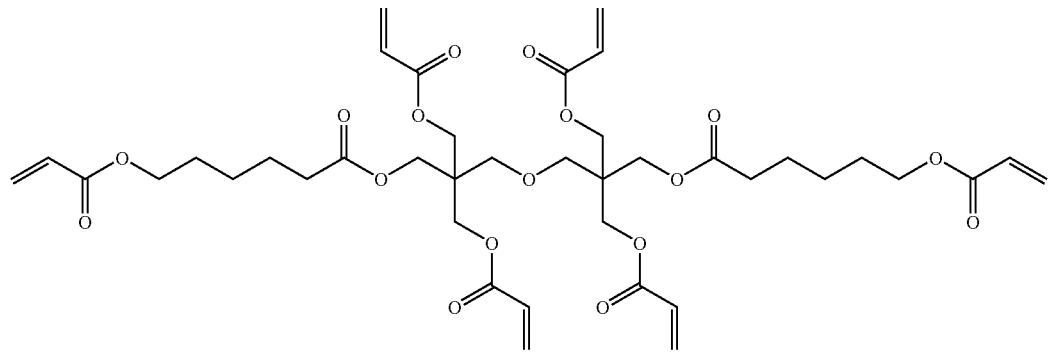

Compound B-6: manufactured by DAICEL-CYTEC COMPANY LTD., WP=214K

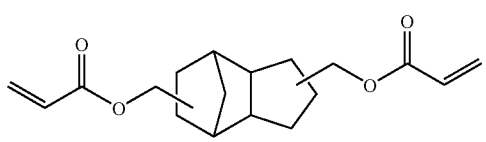

Compound C-1:

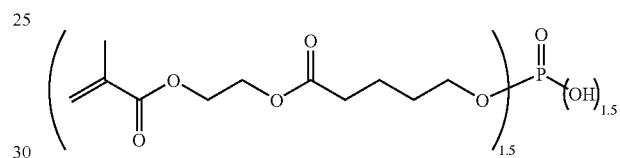

(Formation of Gas Barrier Films (2))

A gas barrier film was formed by the same manner as in the Example 1 in Formation of Gas Bather Films (1), to which, however, Polymerizable compound 1 was changed to Compound IP-85 and the polymerization initiator was changed to diphenyl-4-thio phenoxysulfoniumhexafluoroantimonate.

TABLE 2

| | Organic Layer | | Barrier Property ($g/m^2/day$) | Ra of inorganic layer (Ra) (nm) |
|---|---|---|---|---|
| | Polymerizable Compound 1 | Thickness (nm) | | |
| Example 15 | TP-85 | 500 | $9.0e^{-4}$ | 1.36 |

Compound TP-85:

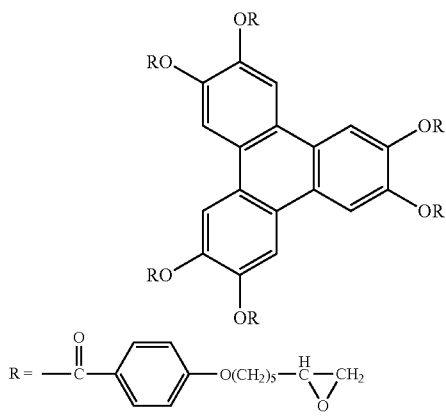

From the result in Table 2, it was found that the gas barrier film having the organic layer which was obtained by using a compound having an epoxy group in stead of an acrylate group as a polymerizable compound also showed good bather property. However, it was found that the gas bather film obtained by using an acrylate showed better bather property than that obtained by using an epoxy.
(Formation of Gas Barrier Films (3))

Each gas bather films was formed by the same manner as in the Example 9 in Formation of Gas Bather Films (1), to which, however, the $Al_2O_3$ of the inorganic layer was changed to an inorganic layer shown in Table 3.

TABLE 3

| | Inorganic layer | | Ra of inorganic layer |
|---|---|---|---|
| Type | Thickness (nm) | Barrier Property (g/m²/day) | (Ra) (nm) |
| Example 16 | $SiO_2$ | 40 | $1.8e^{-3}$ | 1.02 |
| Example 17 | $Si_3N_4$ | 40 | $8.9e^{-4}$ | 0.98 |

From the results in Table 3, it was found that the gas bather film having the organic layer in the present invention and the inorganic layer comprising silicon oxide or silicon nitride also showed good barrier property. It was found that the bather property improved regardless of the type of the inorganic layer in the case where the organic layer in the present invention is used.
(Formation of Gas Bather Films (4))

On a polyethylene naphthalate film (manufactured by Teijin DuPont, Teonex Q65FA, having a thickness of 100 µm),
an organic layer and an inorganic layer were formed in the same manner as each manners in Examples 2 to 11 in Formation of Gas Bather Films (1), then an organic layer and an inorganic layer were further formed in the same manners in that order. Thereby, each gas bather films having a substrate/an organic layer/an inorganic layer/an organic layer/an inorganic layer were obtained (Examples 18 to 27).

The water vapor permeability of the obtained gas bather films was measured in the same manner as in Formation of Gas Bather Films (1). It was found that all of the gas bather films of Examples 18 to 27 had a similar tendency to the corresponding to the gas bather films in Formation of Gas Barrier Films (1).
<Production and Evaluation of Organic EL Device>

In order to evaluate gas bather property, an organic EL device in which vapor or oxygen causes dark spot was formed. An ITO film-having conductive glass substrate (surface resistivity 10 Ω/square) was washed with 2-propanol, and then processed for UV ozone treatment for 10 minutes. On the substrate (anode), the following compound layers were formed in order by vapor deposition according to a vacuum vapor deposition process.
(First Hole Transporting Layer)
Copper phthalocyanine: film thickness 10 nm.
(Second Hole Transporting Layer)
N,N'-diphenyl-N,N'-dinaphthylbenzidine: film thickness 40 nm.
(Light-Emitting Layer Also Serving as Electron Transporting Layer)
Tris(8-hydroxyquinolinato)aluminium: film thickness 60 nm.
(Electron Injection Layer)
Lithium fluoride: film thickness 1 nm.

Metal aluminium was formed on it through vapor deposition to form a cathode having a thickness of 100 nm, and a silicon nitride film having a thickness of 3 µm was formed thereon according to a parallel plate CVD, thereby constructing an organic EL device.

Next, using a thermosetting adhesive (Epotec 310, by Daizo-Nichimori), each gas bather films formed in Formation of Gas Bather Films (3) (Examples 18 to 27) and the organic EL device were stuck together in such a manner that the side of the barrier film substrate laminated with bather layer could be on the side of the organic EL device, and heated at 65° C. for 3 hours to cure the adhesive. 10 test pieces of every sample of the thus-sealed organic EL device were prepared.

Just after produced, the organic EL device was tested for light emission under application of 7 V thereto, using a source measure unit (SMU2400 Model by Keithley). Using a microscope, the light-emitting surface was observed, which confirmed uniform light emission by every device with no dark spot.

Finally, the devices were stored in a dark room at 60° C. and 90% relative humidity (RH) for 300 hours, and then observed for light emission. No gave dark spots larger than 200 µm in diameter was observed. It was found that the devices are good in durability.

INDUSTRIAL APPLICABILITY

Since the gas barrier film of the present invention has high barrier property, it can be widely used for various devices that are required to have barrier property. In the gas barrier film of the present invention, the organic layer has improved smoothness and therefore a smooth inorganic layer can also be formed. This improvement makes it possible to improve smoothness of the outermost surface of the gas barrier film and performance of devices provided on the gas bather Elm. Furthermore, it is quite significant that the gas barrier film of the present invention also exhibits high bather property when it is formed by a sputtering process.

The present disclosure relates to the subject matter contained in Japanese Patent Application No. 233536/2008 filed on Sep. 11, 2008, which is expressly incorporated herein by reference in its entirety. All the publications referred to in the present specification are also expressly incorporated herein by reference in their entirety.

The foregoing description of preferable embodiments of the present invention has been presented for purposes of illustration and description, and is not intended to be exhaustive or to limit the present invention to the precise form disclosed. The description was selected to best explain the principles of the present invention and their practical application to enable others skilled in the art to best utilize the present invention in various embodiments and various modifications as are suited to the particular use contemplated. It is intended that the scope of the present invention not be limited by the specification, but be defined claims set forth below.

What is claimed is:

1. A barrier laminate comprising an organic layer, an inorganic layer on a surface of the organic layer, and another organic layer on a surface of the inorganic layer, wherein the organic layers are formed by curing a polymerizable composition comprising a compound having a triphenylene skeleton and a polymerizable group.

2. The barrier laminate according to claim 1, wherein the triphenylene skeleton and the polymerizable group bond to each other via a linking group having an aromatic ring.

3. The barrier laminate according to claim 1, wherein the compound having a triphenylene skeleton and a polymerizable group has at least two polymerizable groups.

4. The barrier laminate according to claim 1, wherein the compound having a triphenylene skeleton and a polymerizable group is represented by Formula (A);

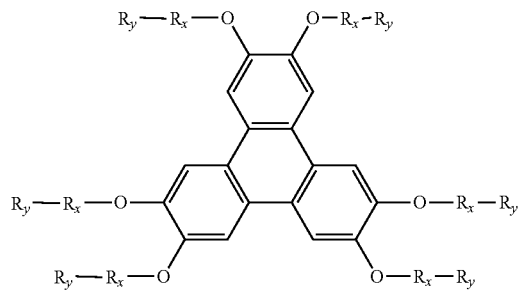

wherein Rx's each are a linking group, and Ry's each are a polymerizable group.

5. The barrier laminate according to claim 1, wherein the polymerizable group is an ethylenic double bond or a ring-opening polymerizable group.

6. The barrier laminate according to claim 1, wherein the compound having a triphenylene skeleton and a polymerizable group is at least one selected from a compound represented by Formula (1), a compound represented by Formula (2), a compound represented by Formula (3) and a compound represented by Formula (4);

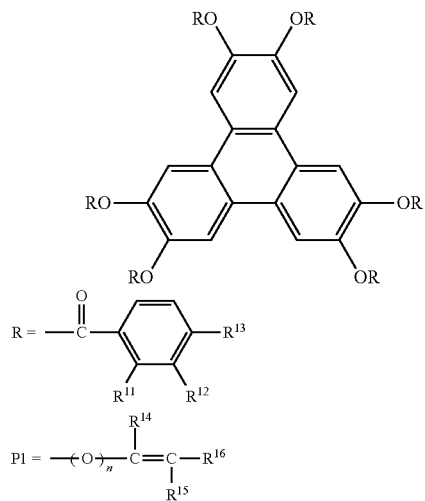

Formula (1)

wherein $R^{11}$ and $R^{12}$ each are a hydrogen atom or a methyl group; $R^{13}$ is an alkoxy group comprising the above substituent P1; $R^{14}$, $R^{15}$ and $R^{16}$ in the substituent P1 each are a hydrogen atom or an alkyl group; and n is 0 or 1;

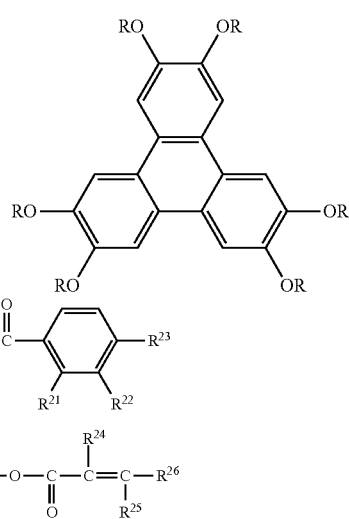

Formula (2)

wherein $R^{21}$ and $R^{22}$ each are a hydrogen atom or a methyl group; $R^{23}$ is an alkoxy group comprising the above substituent P2; and $R^{24}$, $R^{25}$ and $R^{26}$ in the substituent P2 each are a hydrogen atom or an alkyl group;

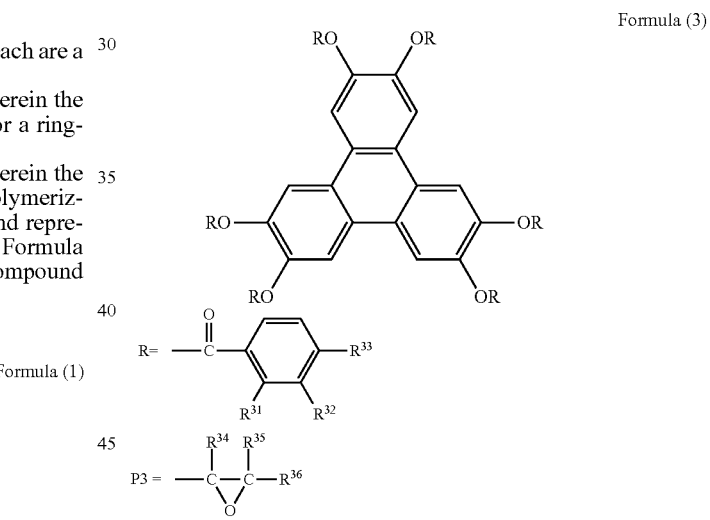

Formula (3)

wherein $R^{31}$ and $R^{32}$ each are a hydrogen atom or a methyl group; $R^{33}$ is an alkoxy group comprising the above substituent P3; and $R^{34}$, $R^{35}$ and $R^{36}$ in the substituent P3 each are a hydrogen atom or an alkyl group;

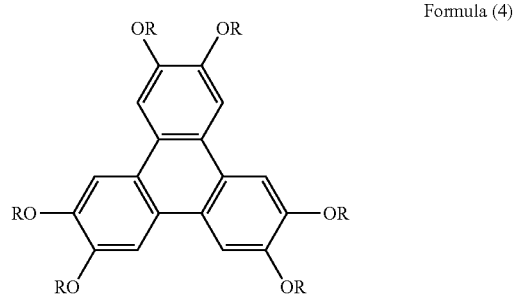

Formula (4)

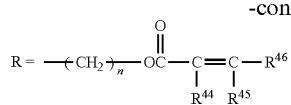

wherein $R^{44}$, $R^{45}$ and $R^{46}$ are a hydrogen atom or an alkyl group; and n is an integer of 2 to 12.

7. The barrier laminate according to claim 1, wherein the polymerizable group is a (meth)acryloyloxy group.

8. The barrier laminate according to claim 1, wherein the compound having a triphenylene skeleton and a polymerizable group is a compound represented by Formula (2);

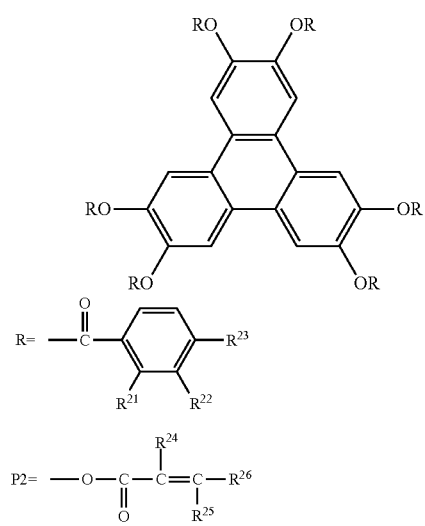

Formula (2)

wherein $R^{21}$ and $R^{22}$ each are a hydrogen atom or a methyl group; $R^{23}$ is an alkoxy group comprising the above substituent P2; and $R^{24}$, $R^{25}$ and $R^{26}$ in the substituent P2 each are a hydrogen atom or an alkyl group.

9. The barrier laminate according to claim 1, wherein the polymerizable composition comprises a bifunctional or more functional (meth)acrylate and the bifunctional or more functional (meth)acrylate does not have a triphenylene skeleton.

10. The barrier laminate according to claim 9, wherein the bifunctional or more functional (meth)acrylate comprises a cyclic structure.

11. The barrier laminate according to claim 9, wherein the bifunctional or more functional (meth)acrylate is represented by Formula (5);

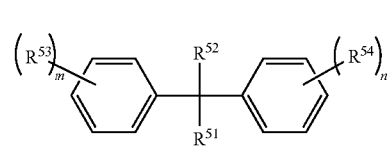

Formula (5)

wherein $R^{51}$ and $R^{52}$ each are a hydrogen atom, an alkyl group, or an aryl group; $R^{51}$ and $R^{52}$ may bond to each other to form a ring; $R^{53}$ and $R^{54}$ each are a substituent; m and n each are an integer of 0 to 5; (m+n) is not less than 2; when m is not less than 2, each $R^{53}$ may be the same or different; when n is not less than 2, each $R^{54}$ may be the same or different; and at least two of $R^{53}$ and $R^{54}$ have a (meth)acryloyloxy group.

12. The barrier laminate according to claim 1, wherein the inorganic layer comprises a metal oxide.

13. The barrier laminate according to claim 12, wherein the metal oxide is silicon oxide, aluminum oxide, or silicon aluminum oxide.

14. The barrier laminate according to claim 12, wherein the inorganic layer comprising a metal oxide is formed by a sputtering process.

15. The barrier laminate according to claim 1, wherein at least two organic layers and at least two inorganic layers are laminated alternately.

16. A gas barrier film comprising a support and a barrier laminate comprising an organic layer, an inorganic layer on a surface of the organic layer, and another organic layer on a surface of the inorganic layer, wherein the organic layers are formed by curing a polymerizable composition comprising a compound having a triphenylene skeleton and a polymerizable group.

17. A device comprising a barrier laminate comprising an organic layer, an inorganic layer on a surface of the organic layer, and another organic layer on a surface of the inorganic layer, wherein the organic layers are formed by curing a polymerizable composition comprising a compound having a triphenylene skeleton and a polymerizable group.

18. The device according to claim 17, comprising, as a substrate, a gas barrier film comprising the barrier laminate.

19. The device according to claim 17, sealed with a gas barrier film comprising the barrier laminate, or the barrier laminate.

20. The device according to claim 17, which is an electronic device.

21. The device according to claim 17, which is an organic EL device.

* * * * *